United States Patent
Lai

(10) Patent No.: US 12,040,406 B2
(45) Date of Patent: Jul. 16, 2024

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventor: Erh-Kun Lai, Taichung County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 367 days.

(21) Appl. No.: 17/504,599

(22) Filed: Oct. 19, 2021

(65) Prior Publication Data
US 2023/0118088 A1    Apr. 20, 2023

(51) Int. Cl.
*H01L 29/786* (2006.01)
*H01L 21/8234* (2006.01)
(Continued)

(52) U.S. Cl.
CPC ............ *H01L 29/78618* (2013.01); *H01L 21/823418* (2013.01); *H01L 21/823468* (2013.01); *H01L 29/42392* (2013.01); *H01L 29/6656* (2013.01)

(58) Field of Classification Search
CPC ....... H01L 21/02603; H01L 21/823418; H01L 21/823431; H01L 21/823468; H01L 21/823821; H01L 21/845; H01L 27/0886; H01L 27/0924; H01L 27/1211; H01L 29/0665; H01L 29/0669; H01L 29/0673; H01L 29/41791; H01L 29/42392; H01L 29/66439; H01L 29/66545; H01L 29/66795; H01L 29/775; H01L 29/785; H01L 29/7851; H01L 29/7853; H01L 29/7855; H01L 29/78618; H01L 2029/7858
See application file for complete search history.

(56) References Cited

U.S. PATENT DOCUMENTS 10,103,238 B1 *  10/2018  Zang .................... H01L 21/311
10,388,732 B1     8/2019  Frougier
(Continued)

FOREIGN PATENT DOCUMENTS

JP    2021097209 A    6/2021
TW    202133244 A     9/2021

OTHER PUBLICATIONS

JPO Office Action dated Feb. 14, 2023 in Japanese application No. 2022-025723.
(Continued)

*Primary Examiner* — David C Spalla
(74) *Attorney, Agent, or Firm* — McClure, Qualey & Rodack, LLP

(57) ABSTRACT

A semiconductor structure is provided. The semiconductor structure includes a substrate and a bottom dielectric layer continuously disposed on the substrate. The semiconductor structure further includes a plurality of stacks disposed on the bottom dielectric layer. Each of the stacks includes gate electrodes and semiconductor layers disposed alternately. The semiconductor structure further includes a plurality of source/drain structures disposed on the bottom dielectric layer and between the stacks. The semiconductor structure further includes a plurality of conductors landed on highest gate electrodes of the stacks.

20 Claims, 43 Drawing Sheets

(51) Int. Cl.
*H01L 29/423* (2006.01)
*H01L 29/66* (2006.01)

(56) References Cited

U.S. PATENT DOCUMENTS

| | | | |
|---|---|---|---|
| 2014/0151639 A1* | 6/2014 | Chang | H01L 29/0673 257/27 |
| 2015/0340490 A1* | 11/2015 | An | H01L 29/785 257/401 |
| 2018/0358435 A1 | 12/2018 | Mochizuki et al. | |
| 2020/0066872 A1 | 2/2020 | Lin et al. | |
| 2020/0105929 A1 | 4/2020 | Zhang | |
| 2020/0303500 A1* | 9/2020 | Loubet | B82Y 10/00 |
| 2020/0343372 A1 | 10/2020 | Yu | |
| 2021/0043727 A1 | 2/2021 | Frougier et al. | |
| 2021/0183858 A1* | 6/2021 | Khaderbad | H01L 29/0673 |
| 2021/0184032 A1 | 6/2021 | Nidhi et al. | |
| 2021/0202696 A1 | 7/2021 | Guha | |
| 2021/0234018 A1 | 7/2021 | Xie et al. | |

OTHER PUBLICATIONS

Japanese language office action dated Aug. 8, 2023, issued in application No. JP 2022-025723.
English language translation of office action dated Aug. 8, 2023 (pp. 1-5 of attachment).

* cited by examiner

SEMICONDUCTOR STRUCTURE AND METHOD FOR MANUFACTURING THE SAME

TECHNICAL FIELD

This disclosure relates to a semiconductor structure and a method for manufacturing the same. More particularly, this disclosure relates to a semiconductor structure comprising a continuously disposed bottom dielectric layer and a method for manufacturing the same.

BACKGROUND

In a three-dimensional semiconductor structure, electronic devices may be formed over a substrate and physically separated from the substrate. However, as the three-dimensional semiconductor structure shrinks, unwanted electrical characteristics may appear and become critical, even though the physically separation remains in the structure. For example, channels of transistors may be formed in silicon semiconductor layers over a substrate, and at the same time, a parasitic channel may be formed in the silicon substrate thereunder. When the gate length becomes smaller, sensitivity to a leakage caused by the parasitic channel more pronounces. In order to reduce the effect of the parasitic channel, a source/drain recess depth may be increased. However, such a modification will lead to increases of source cutoff current (Isoff), subthreshold slope saturation (SSsat), and effective capacitance (Ceff) with no benefit to on-state current.

SUMMARY

The disclosure is directed to a solution of the problem as described above.

According to some embodiments, a semiconductor structure is provided. The semiconductor structure comprises a substrate and a bottom dielectric layer continuously disposed on the substrate. The semiconductor structure further comprises a plurality of stacks disposed on the bottom dielectric layer. Each of the stacks comprises gate electrodes and semiconductor layers disposed alternately. The semiconductor structure further comprises a plurality of source/drain structures disposed on the bottom dielectric layer and between the stacks. The semiconductor structure further comprises a plurality of conductors landed on highest gate electrodes of the stacks.

According to some embodiments, a method for manufacturing a semiconductor structure is provided. The method comprises the following steps. First, a substrate is provided. A bottom dielectric layer continuous on the substrate is formed. A plurality of stacks are formed on the bottom dielectric layer. Each of the stacks comprises gate electrodes and semiconductor layers disposed alternately. A plurality of source/drain structures are formed the bottom dielectric layer and between the stacks. A plurality of conductors are formed on highest gate electrodes of the stacks.

Figure 1A:
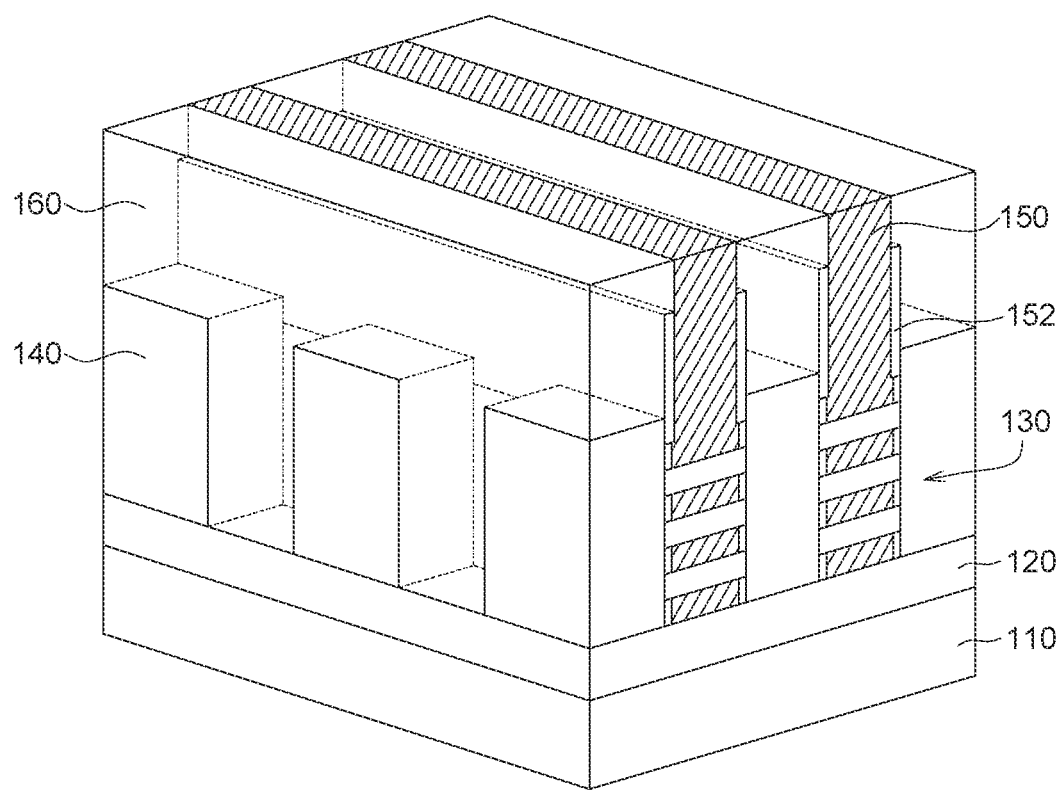
FIGS. 1A-1B illustrate an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The following description and the accompanying drawings are provided for illustrative only, and not intended to result in a limitation. The same reference numerals are used for the same components. For clarity, the components may not be drawn to scale. In addition, some components and/or reference numerals may be omitted from some drawings. It is contemplated that the elements and features of one embodiment can be beneficially incorporated in another embodiment without further recitation.

Figure 1B:
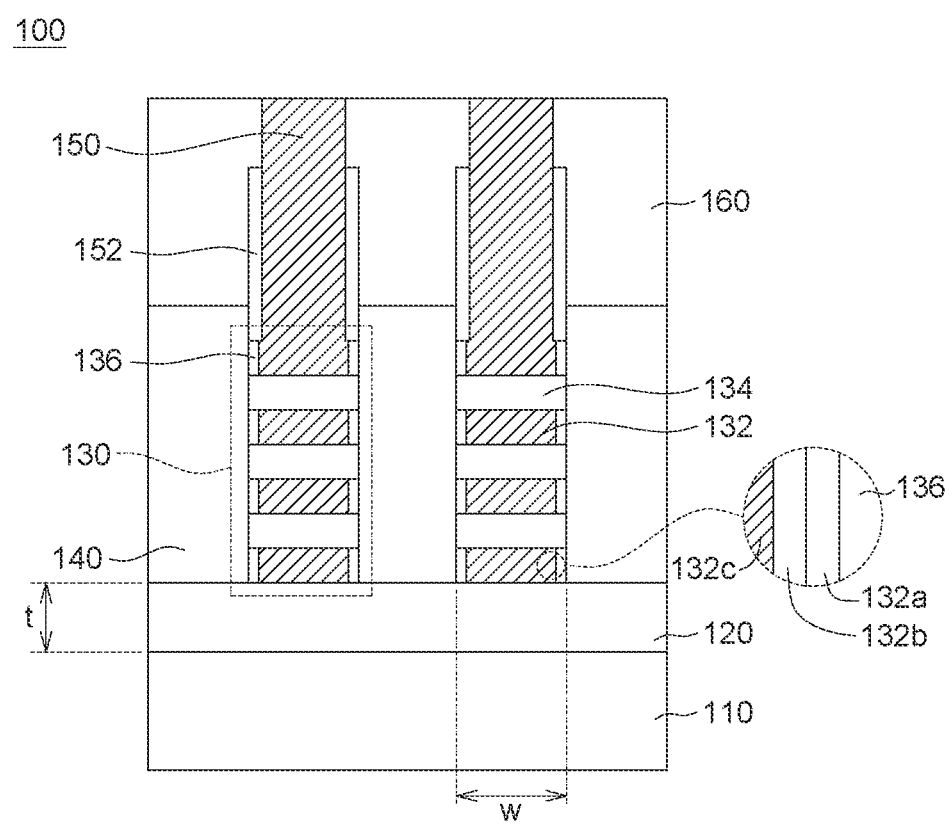

FIGS. 1A-1B illustrate an exemplary semiconductor structure 100 according to embodiments, wherein FIG. 1A is a perspective view, and FIG. 1B is a cross-sectional view. The semiconductor structure 100 comprises a substrate 110 and a bottom dielectric layer 120 continuously disposed on the substrate 110. The semiconductor structure 100 further comprises a plurality of stacks 130 disposed on the bottom dielectric layer 120. Each of the stacks 130 comprises gate electrodes 132 and semiconductor layers 134 disposed alternately. The semiconductor structure 100 further comprises a plurality of source/drain structures 140 disposed on the bottom dielectric layer 120 and between the stacks 130. The semiconductor structure 100 further comprises a plurality of conductors 150 landed on highest gate electrodes 132 of the stacks 130.

More specifically, the substrate 110 may comprise silicon. The bottom dielectric layer 120 may comprise oxide, but the disclosure is not limited thereto. In some embodiments, the bottom dielectric layer 120 has a thickness t of 5 nm to 100 nm. According to some embodiments, the gate electrodes 132 of the stacks 130 may comprise a buffered oxide 132a, a high k material 132b and a metal gate material 132c. The semiconductor layers 134 may comprise silicon. In some embodiments, each of the stacks 130 further comprises inner spacers 136. The inner spacers 136 are disposed on sidewalls of the gate electrodes 132. In some embodiments, the stacks 130 has a width w of 2 nm to 200 nm. While the semiconductor structure 100 is illustrated to have gate-all-around structures, the disclosure is not limited thereto. According to some embodiments, the conductors 150 may comprise same materials as the gate electrodes 132. In some embodiments, as shown in FIGS. 1A-1B, a horizontal size of the conductors 150 is smaller a horizontal size of the gate electrodes 132. In some embodiments, the semiconductor structure 100 further comprises outer spacers 152. The outer spacers 152 are disposed on sidewalls of the conductors 150. According to some embodiments, each of the conductors 150 may electrically connect two or more of the stacks 130 in an extending direction of the conductors 150, and a number of the source/drain structures 140 in each row along the extending direction of the conductors 150 may correspond to a number of the stacks 130 electrically connected by one conductor 150. In cases that the semiconductor structure 100 is a 3D memory structure, memory cells can be defined by the gate electrodes 132 and the source/drain structures 140.

With the bottom dielectric layer 120, the parasitic channel can be suppressed without increase of a source/drain recess depth. As such, the leakage resulted therefrom can be reduced. In addition, a capacitance can be further reduced. Also, a gate leakage may be further reduced.

Now the description is directed to an exemplary method for manufacturing the semiconductor structure 100 according to embodiments. The method comprises the following steps. First, a substrate 110 is provided. A bottom dielectric layer 120 continuous on the substrate 110 is formed. A plurality of stacks 130 are formed on the bottom dielectric layer 120. Each of the stacks 130 comprises gate electrodes 132 and semiconductor layers 134 disposed alternately. A plurality of source/drain structures 140 are formed on the bottom dielectric layer 120 and between the stacks 130. A plurality of conductors 150 are formed on highest gate electrodes 132 of the stacks 130. Details of the method are provided with reference to FIGS. 2A-2B to FIGS. 20A-20F.

Figure 2A:
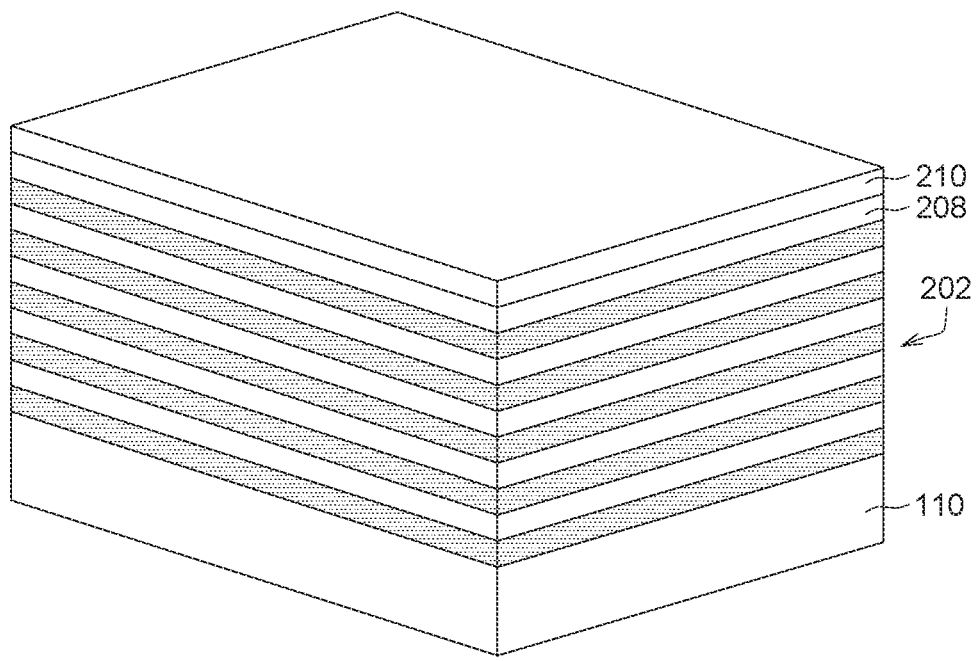
FIGS. 2A-2B to FIGS. 20A-20F illustrate various stages of an exemplary method for manufacturing a semiconductor structure according to embodiments.
Figure 2B:
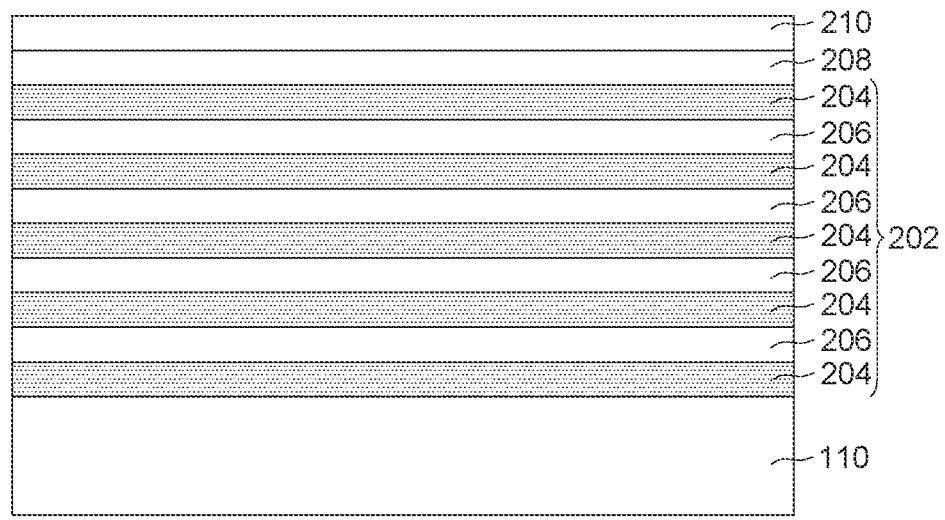

FIGS. 2A-2B illustrates an initial structure, wherein FIG. 2A is a perspective view, and FIG. 2B is a cross-sectional view. As shown in FIGS. 2A-2B, an initial stack 202 composed of alternate sacrificial layers 204 and semiconductor layers 206 may be formed on the substrate 110. The sacrificial layers 204 may be formed of SiGe, and the semiconductor layers 206 may be formed of Si, but the disclosure is not limited thereto. According to some embodiments, the lowest sacrificial layer 204 of the stack 202 may be disposed on the substrate 110, and the lowest semiconductor layer 206 may be disposed on the lowest sacrificial layer 204. A hard mask 208 is formed on the stack 202. A hard mask 210 is formed on the hard mask 208. The stack 202, the hard mask 208, and the hard mask 210 may be formed by deposition processes, respectively, but the disclosure is not limited thereto.

Figure 3A:
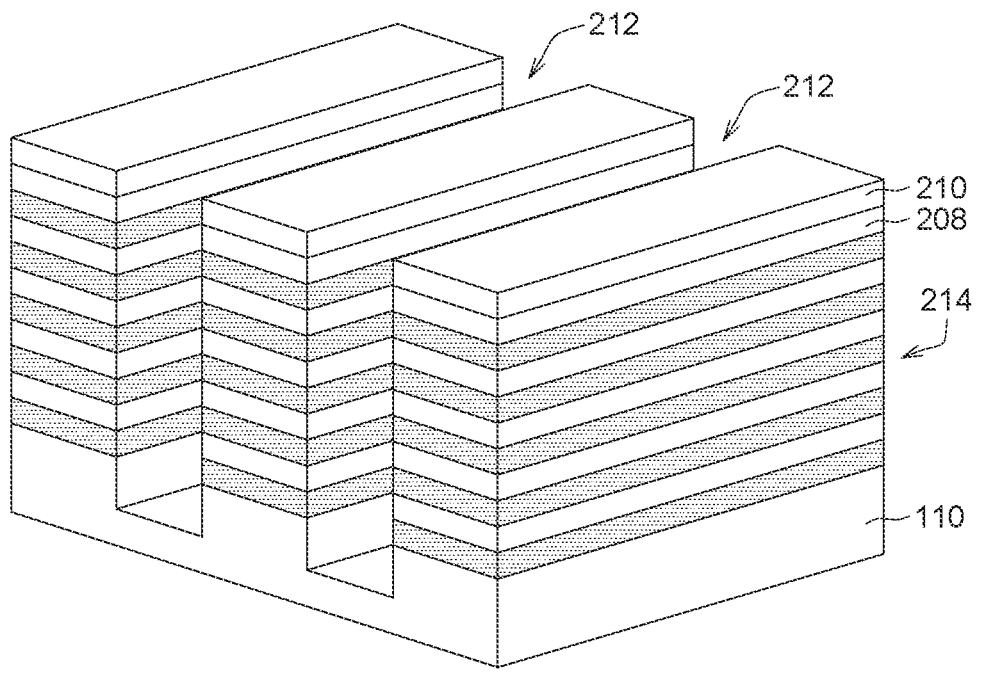
Figure 3B:
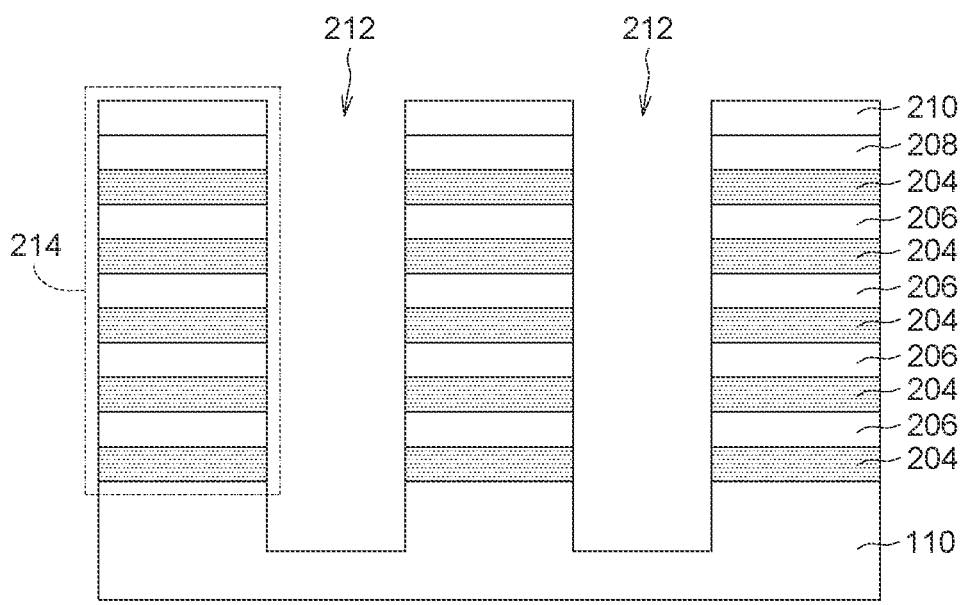

FIGS. 3A-3B illustrates a following structure, wherein FIG. 3A is a perspective view, and FIG. 3B is a cross-sectional view. As shown in FIGS. 3A-3B, a plurality of trenches 212 is formed, so as to divide the stack 202 into a plurality of preliminary stacks 214. In some embodiments, the preliminary stacks 214 has a width of 2 nm to 200 nm. The trenches 212 may be formed by a shallow trench isolation process, but the disclosure is not limited thereto.

Thereafter, the lowest sacrificial layers 204 and the lowest semiconductor layers 206 of the preliminary stacks 214 can be removed through the steps illustrated in FIGS. 4A-4B to FIGS. 9A-9B.

Figure 4A:
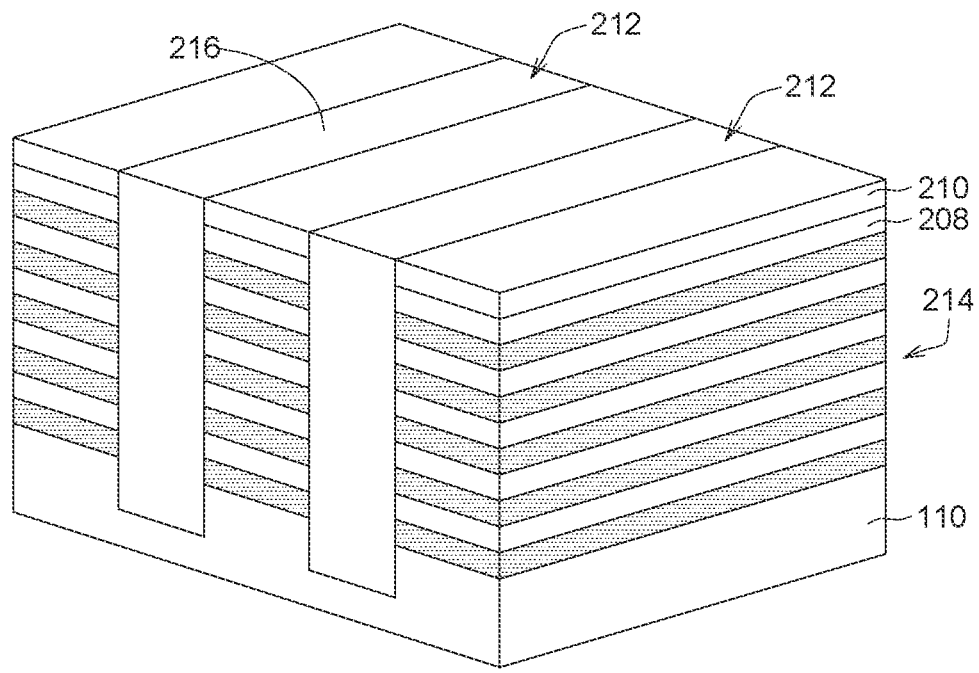
Figure 4B:
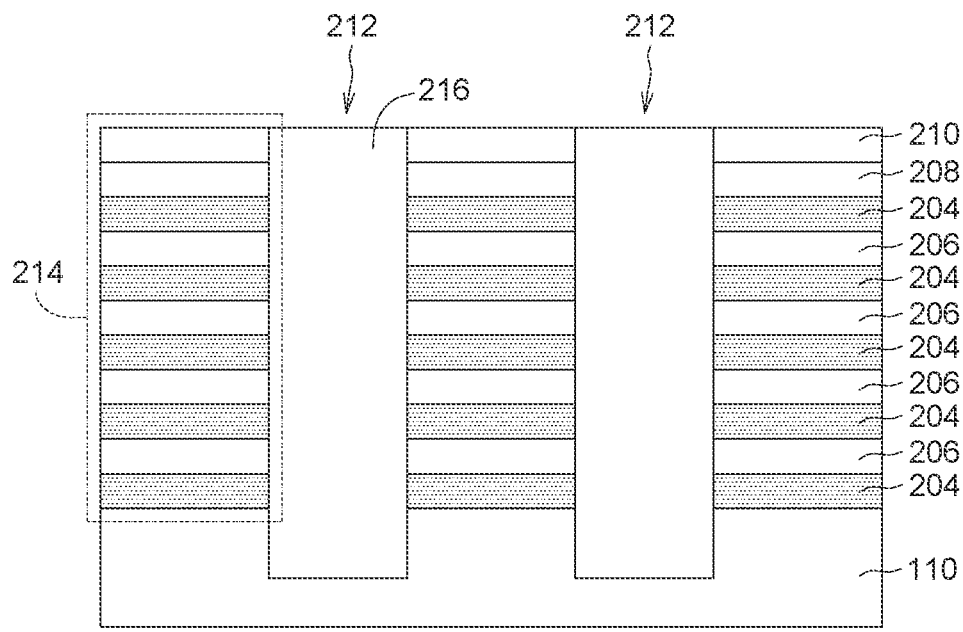

FIGS. 4A-4B illustrates a following structure after FIGS. 3A-3B, wherein FIG. 4A is a perspective view, and FIG. 4B is a cross-sectional view. Optionally, a liner layer (not shown) may be formed in the trenches 212. The liner layer may be oxide and be formed by an in-situ steam generated (ISSG) oxidation process, but the disclosure is not limited thereto. Then, as shown in FIGS. 4A-4B, a barrier material 216 is filled into the trenches. The barrier material 216 may be oxide and be formed by a deposition process and a chemical mechanical planarization (CMP) process, but the disclosure is not limited thereto.

Figure 5A:
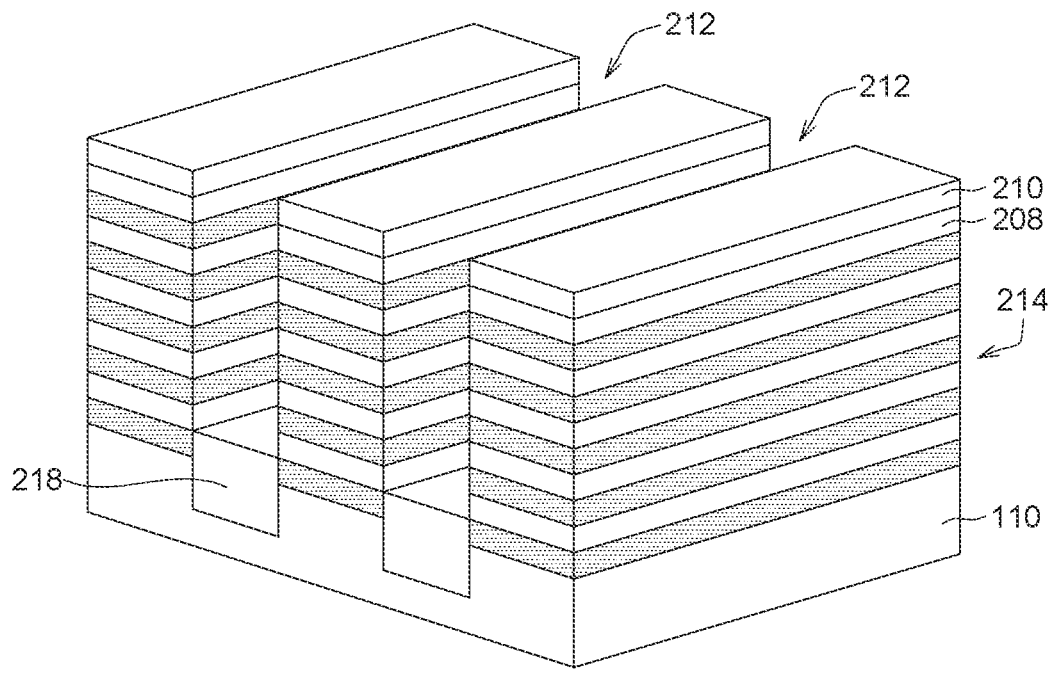
Figure 5B:
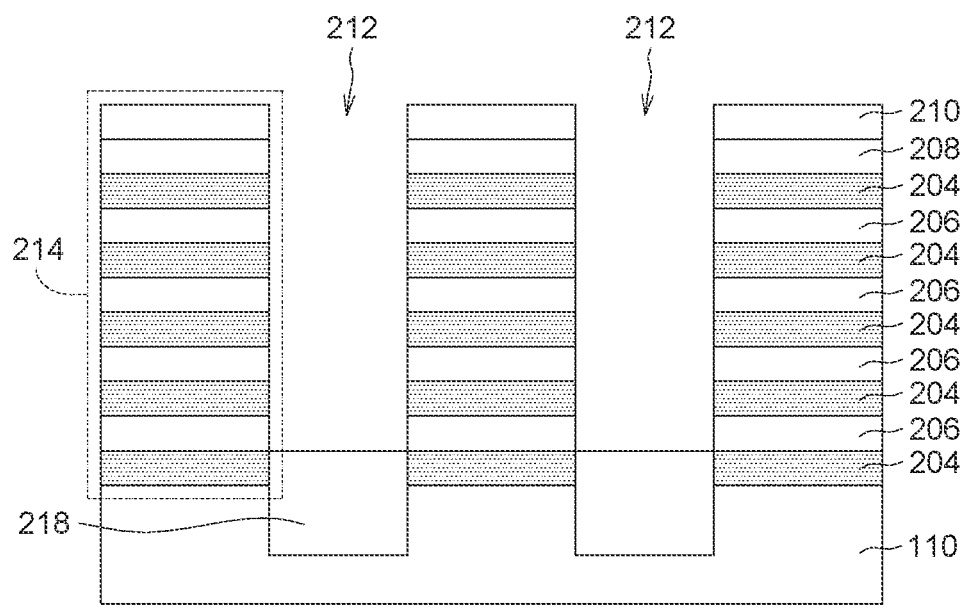

FIGS. 5A-5B illustrates a following structure, wherein FIG. 5A is a perspective view, and FIG. 5B is a cross-sectional view. As shown in FIGS. 5A-5B, redundant portions of the barrier material 216 is removed. As such, barriers 218 are formed into the trenches 212. The barriers 218 have top surfaces aligned with top surfaces of the lowest sacrificial layers 204. The redundant portions of the barrier material 216 may be removed by a reactive ion etching (RIE) process, but the disclosure is not limited thereto. The process of this step is similar to finFET shallow trench isolation (STI) process. The STI oxide recess process can well controlled.

Figure 6A:
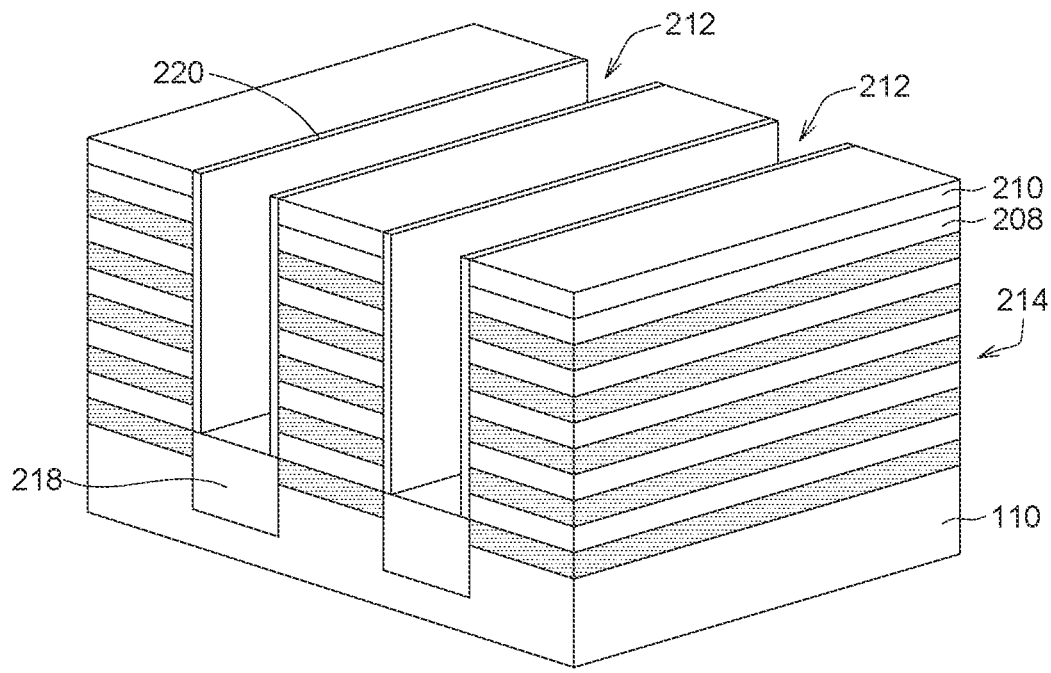
Figure 6B:
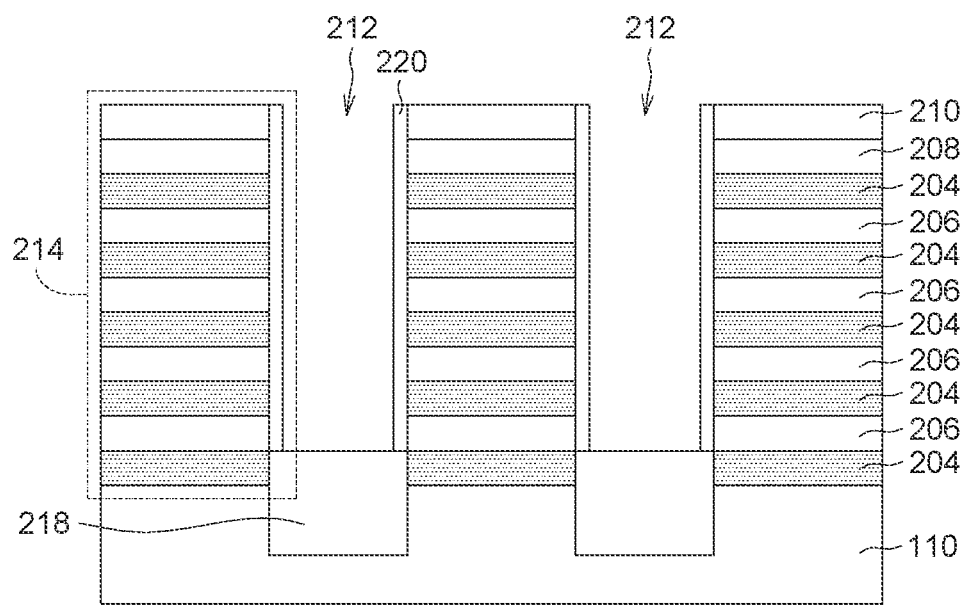

FIGS. 6A-6B illustrates a following structure, wherein FIG. 6A is a perspective view, and FIG. 6B is a cross-sectional view. As shown in FIGS. 6A-6B, disposable spacers 220 are formed on sidewalls of the preliminary stacks 214, the disposable spacers 220 stop on the top surfaces of the barriers 218. The disposable spacers 220 may be formed by a deposition process and a RIE process, but the disclosure is not limited thereto.

Figure 7A:
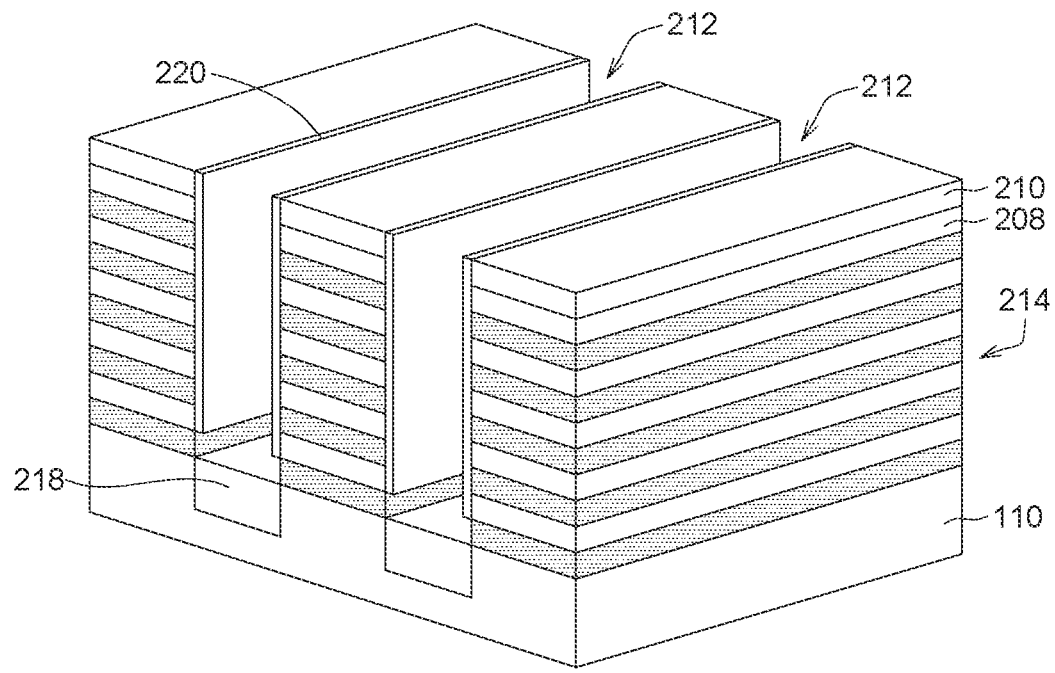
Figure 7B:
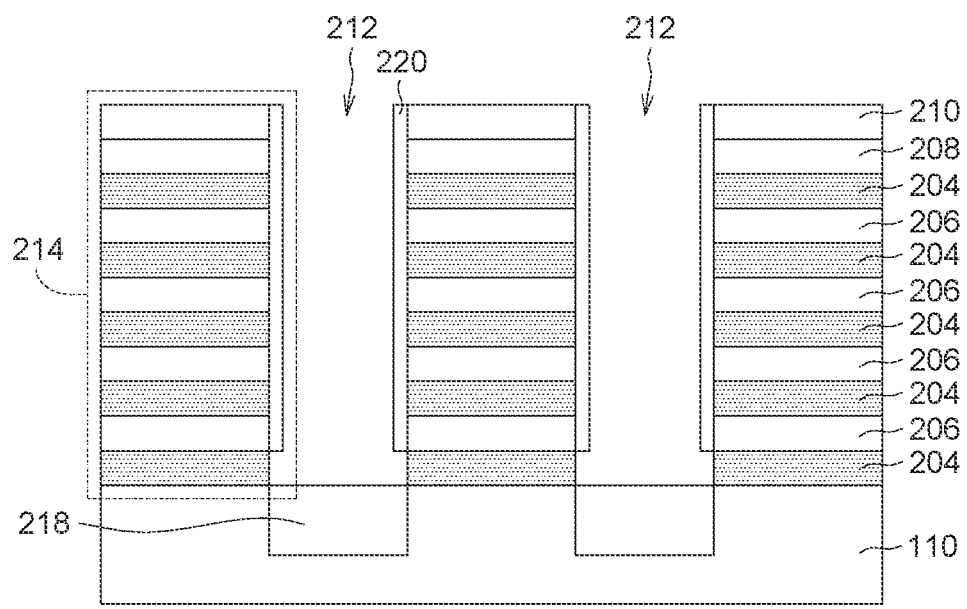

FIGS. 7A-B illustrates a following structure, wherein FIG. 7A is a perspective view, and FIG. 7B is a cross-sectional view. As shown in FIGS. 7A-7B, portions of the barriers 218 covering the lowest sacrificial layers 204 are removed.

Figure 8A:
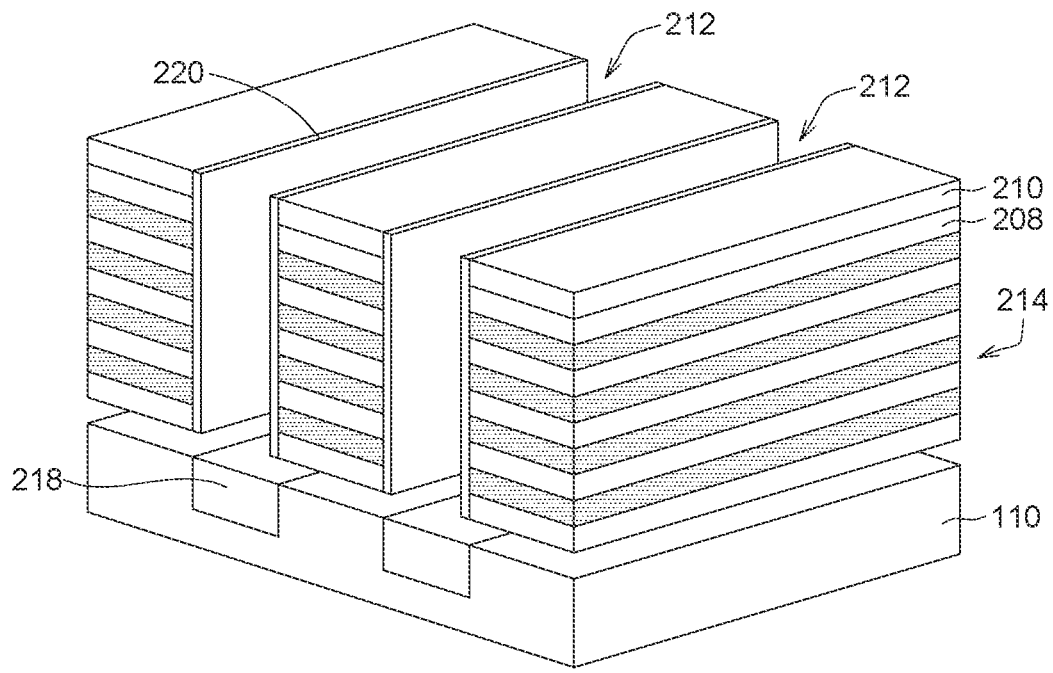
Figure 8B:
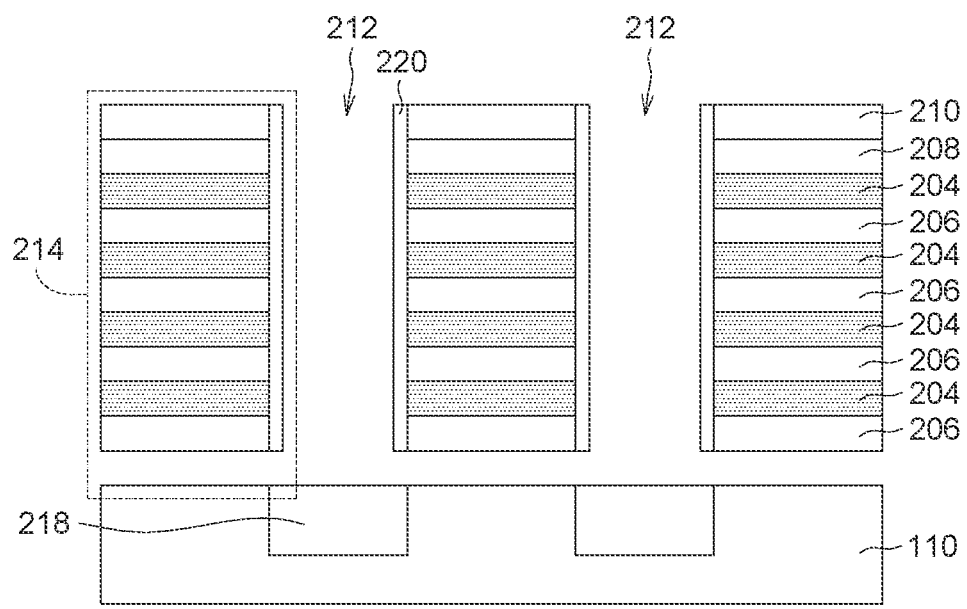

FIGS. 8A-8B illustrates a following structure, wherein FIG. 8A is a perspective view, and FIG. 8B is a cross-sectional view. As shown in FIGS. 8A-8B, a first selective etching process may be conducted to remove the lowest sacrificial layers 204. The preliminary stacks 214 may be supported by an outside buttress (not shown), and thus the preliminary stacks 214 will not collapse.

Figure 9A:
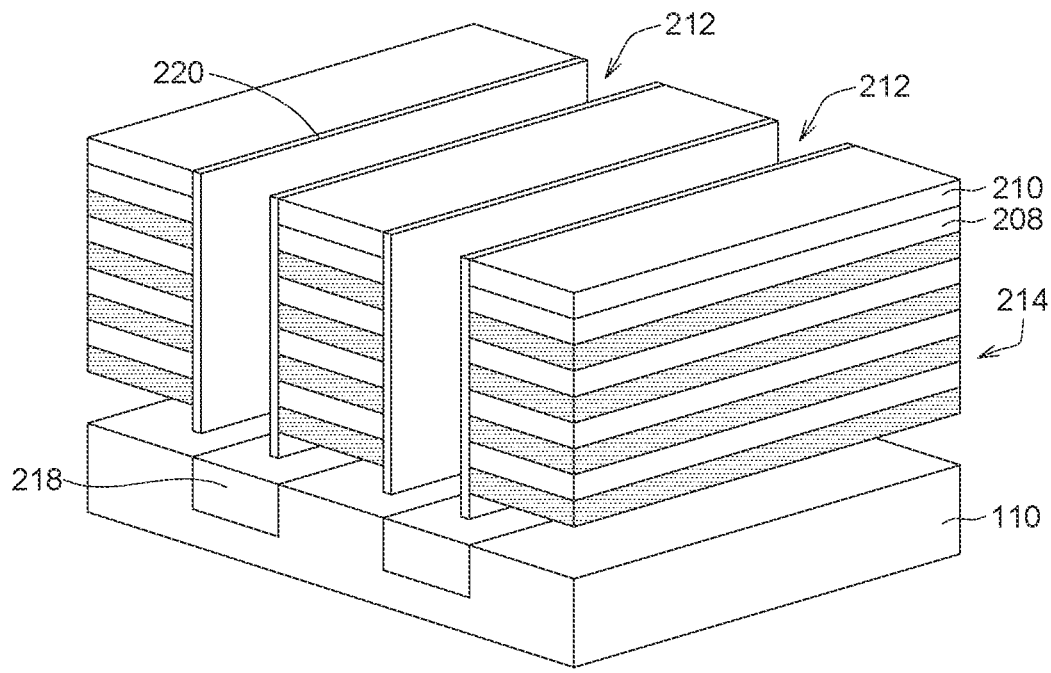
Figure 9B:
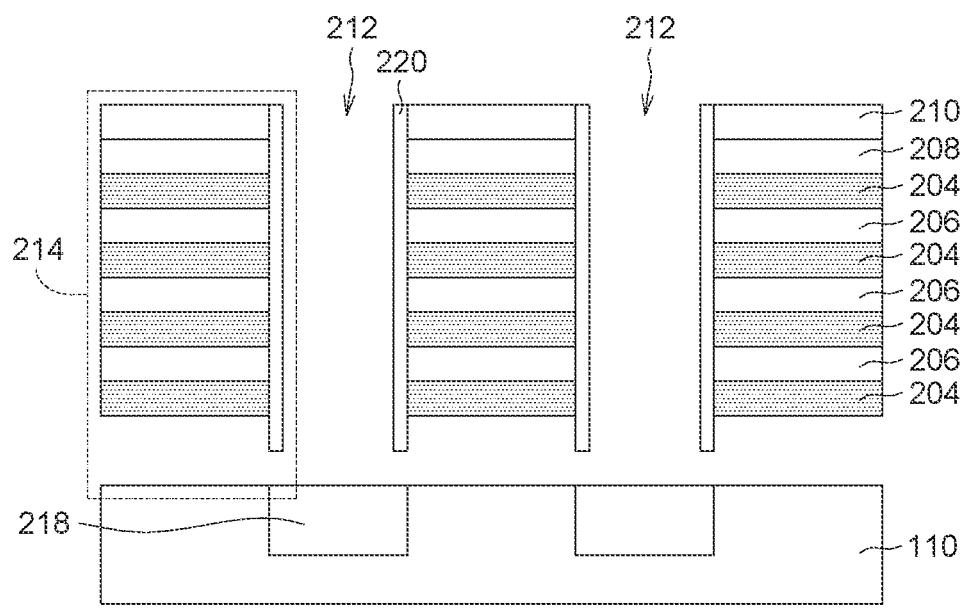

FIGS. 9A-9B illustrates a following structure, wherein FIG. 9A is a perspective view, and FIG. 9B is a cross-sectional view. As shown in FIGS. 9A-9B, a second selective etching process may be conducted to remove the lowest semiconductor layers 206. In some embodiments, a top portion of the substrate 110 may also be etched.

Figure 10A:
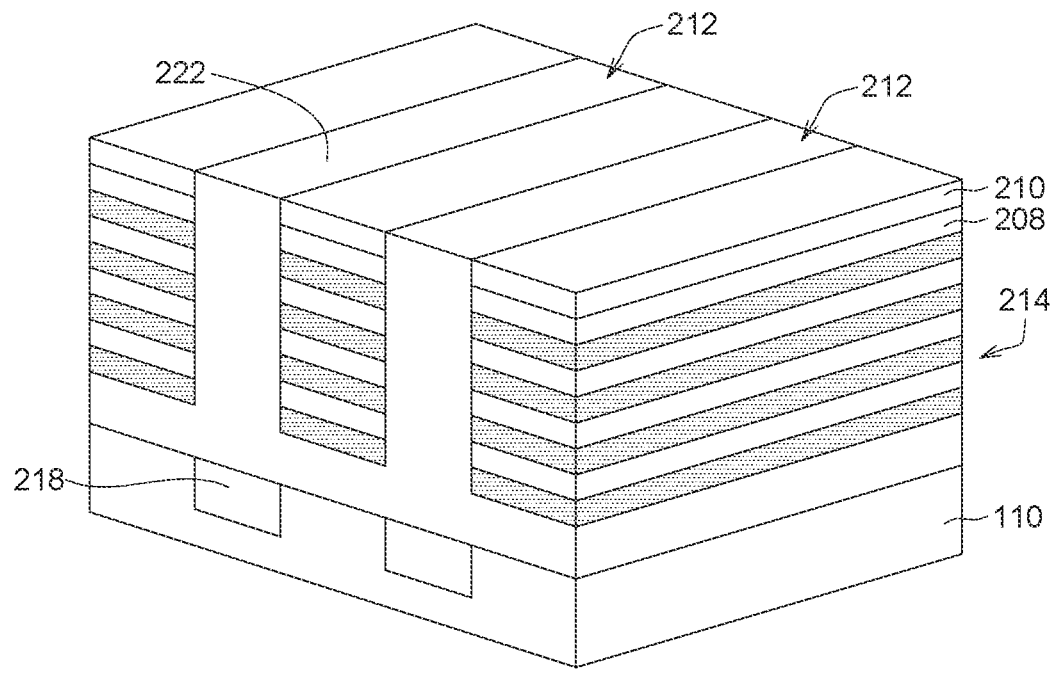
Figure 10B:
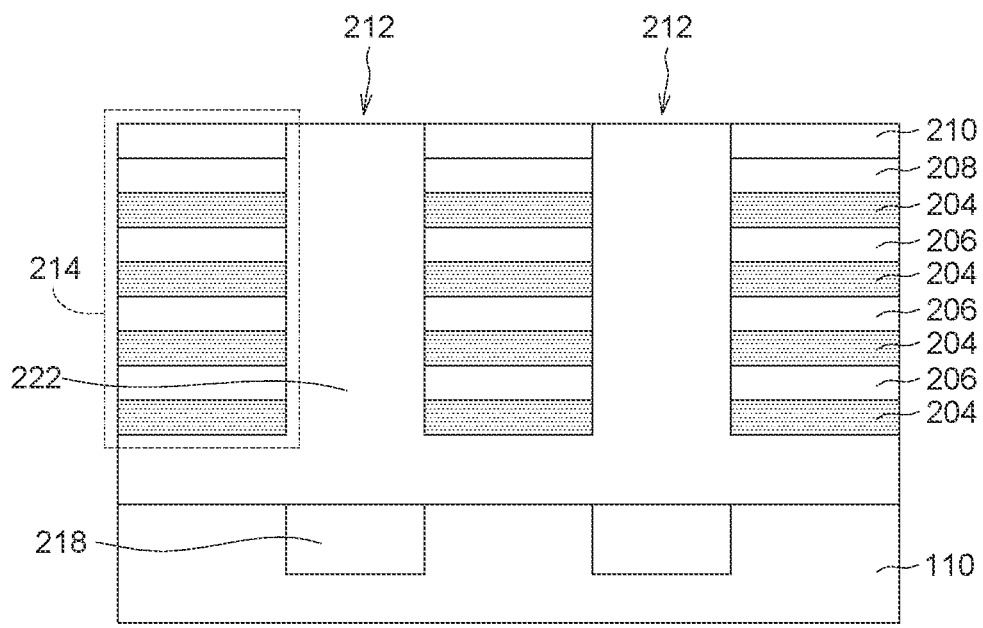

FIGS. 10A-10B illustrates a following structure, wherein FIG. 10A is a perspective view, and FIG. 10B is a cross-sectional view. As shown in FIGS. 10A-10B, the disposable spacers 220 are removed. The disposable spacers 220 may be removed by a RIE process, but the disclosure is not limited thereto. Then, a bottom dielectric material 222 is provided. The bottom dielectric material 222 is provided to the trenches 212 and further fills into spaces caused by removing the lowest sacrificial layers 204 and the lowest semiconductor layers 206. The bottom dielectric material 222 may be oxide, but the disclosure is not limited thereto. In some embodiments, the bottom dielectric material 222 is the same as the material of the barriers 218, and no obvious boundary can be seen. The bottom dielectric material 222 may be provided by a deposition process, and a CMP process may be conducted thereafter, but the disclosure is not limited thereto.

Figure 11A:
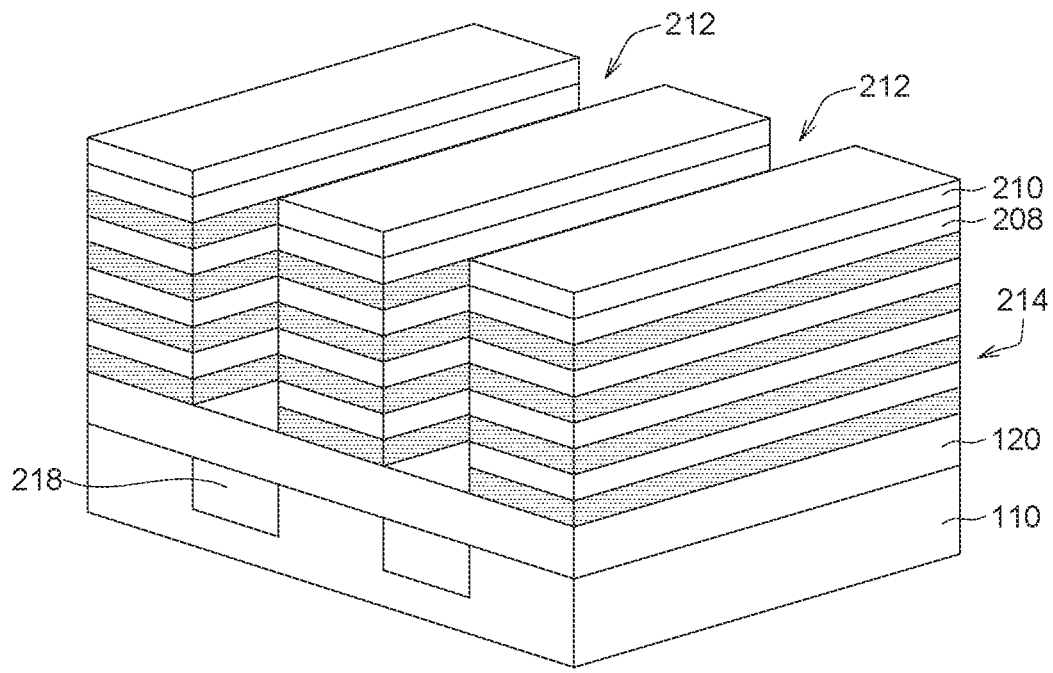
Figure 11B:
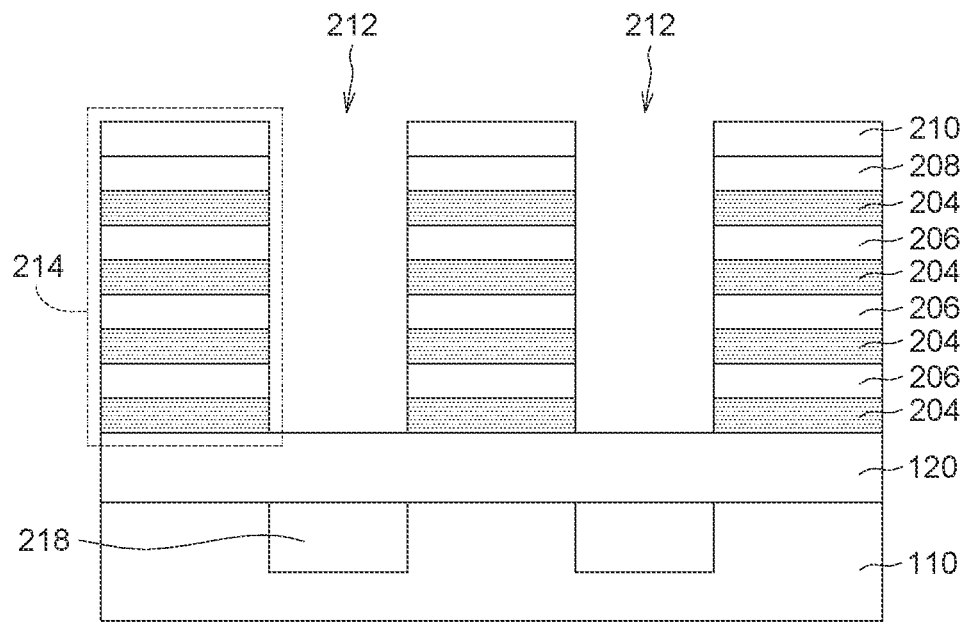

FIGS. 11A-11B illustrates a following structure, wherein FIG. 11A is a perspective view, and FIG. 11B is a cross-sectional view. As shown in FIGS. 11A-11B, redundant portions of the bottom dielectric material 222 is removed. As such, a bottom dielectric layer 120 continuous on the substrate 110 is formed. The bottom dielectric layer 120 has a thickness equal to or larger than a sum of a thickness of one sacrificial layer 204 and a thickness of one semiconductor layer 206. The bottom dielectric layer 120 may have a thickness of 5 nm to 100 nm. In cases that the bottom dielectric material 222 is the same as the material of the barriers 218, the barriers 218 may be seen to be incorporated into the bottom dielectric layer 120, and thus the bottom dielectric layer 120 has some thicker portions.

Figure 12A:
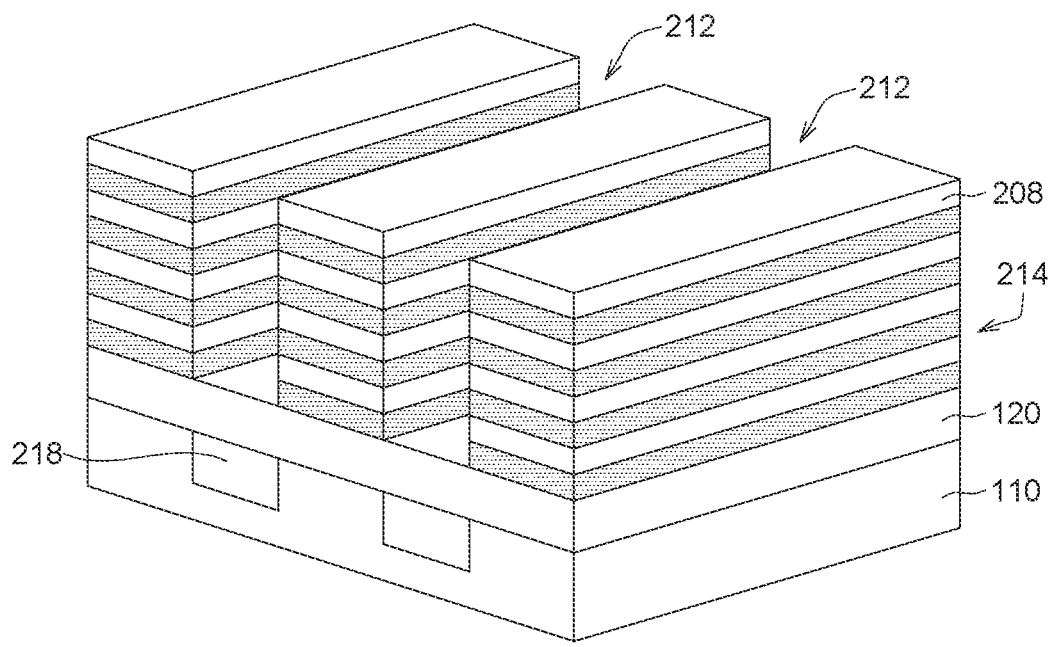
Figure 12B:
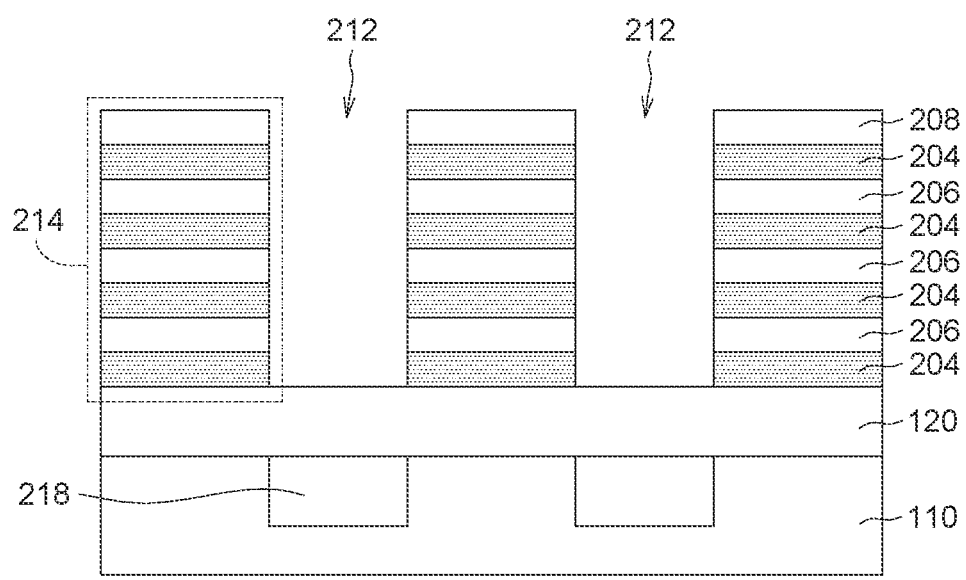

FIGS. 12A-12B illustrates a following structure, wherein FIG. 12A is a perspective view, and FIG. 12B is a cross-sectional view. As shown in FIGS. 12A-12B, the hard mask 210 is removed.

Figure 13A:
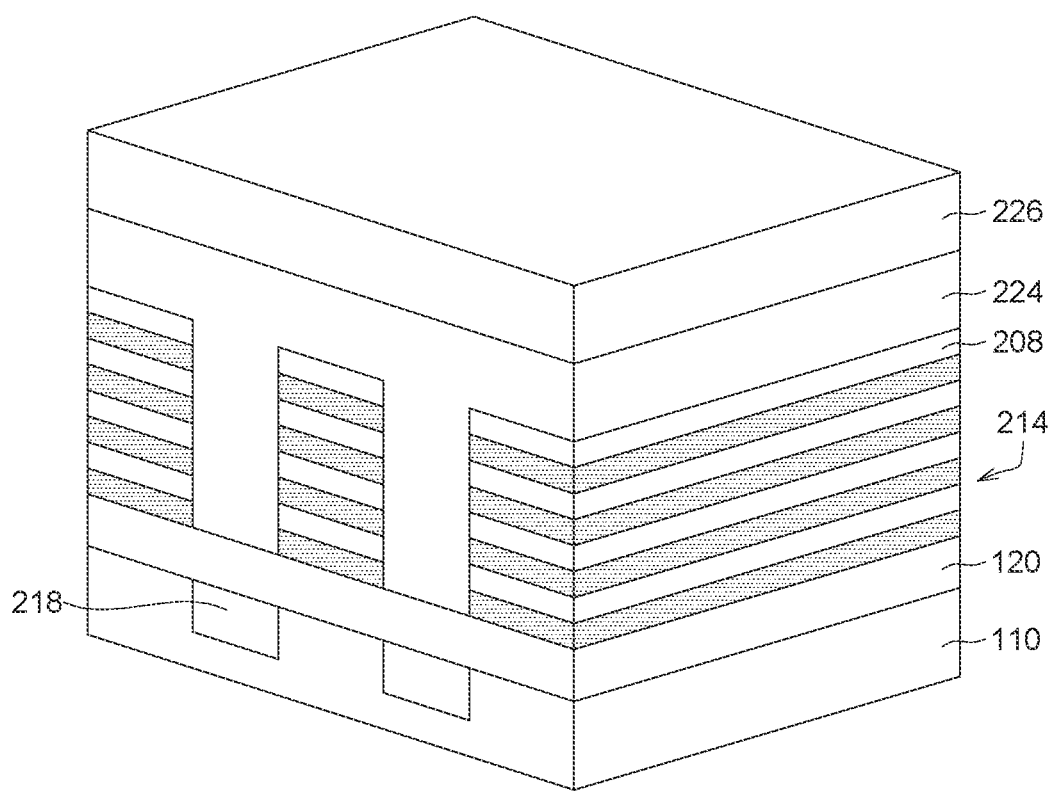
Figure 13B:
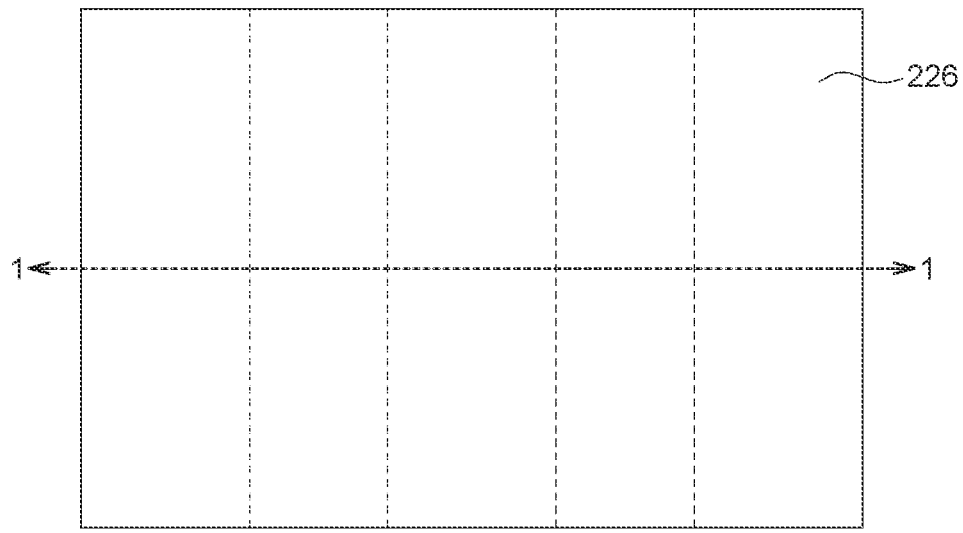
Figure 13C:
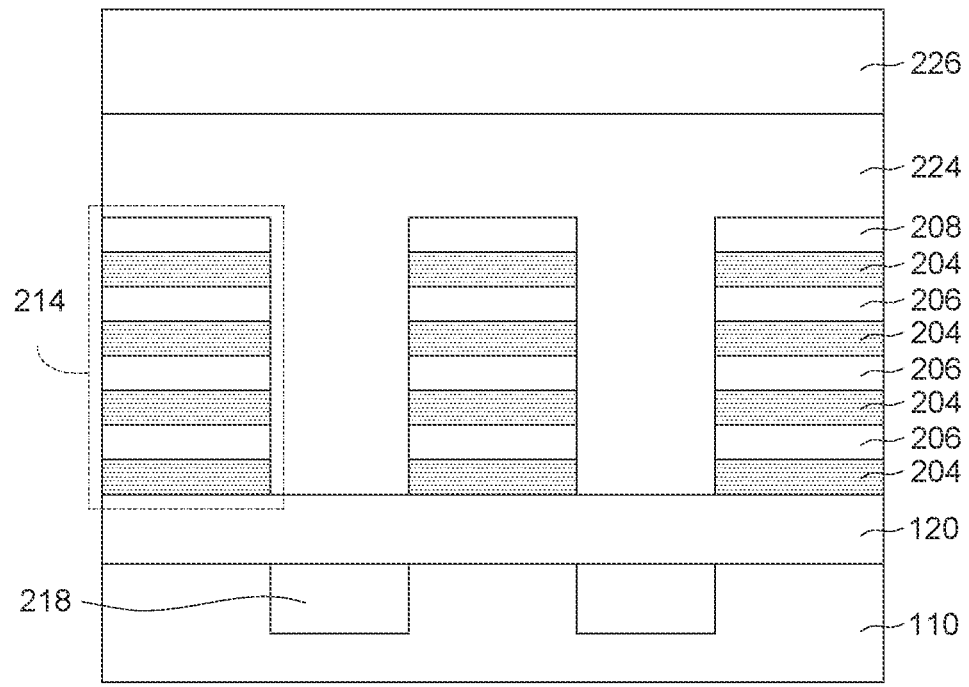

FIGS. 13A-13O illustrates a following structure, wherein FIG. 13A is a perspective view, FIG. 13B is a top view, and FIG. 13O is a cross-sectional view of line 1-1 in FIG. 13B.

As shown in FIGS. 13A-13O, a dummy gate material 224 is provided. The dummy gate material 224 fills into the trenches 212 and covers the preliminary stacks 214. A hard mask material 226 is provided onto the dummy gate material 224. The dummy gate material 224 and the hard mask material 226 may be provided by deposition processes and optional CMP processes, respectively, but the disclosure is not limited thereto.

Figure 14A:
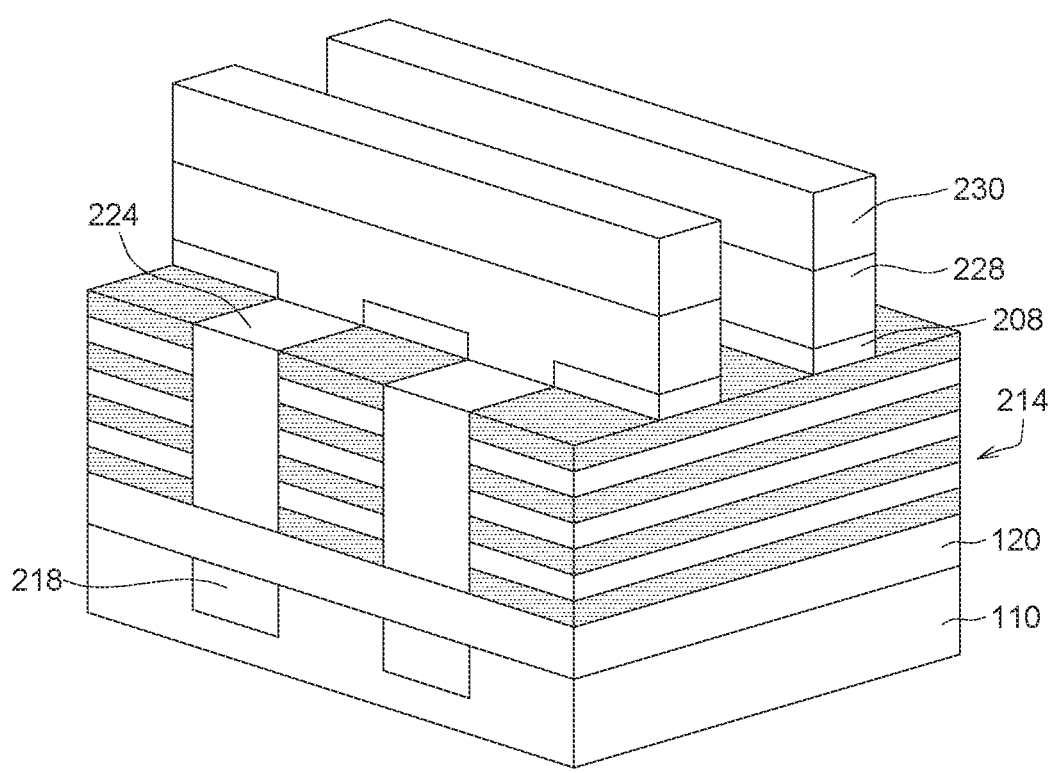
Figure 14B:
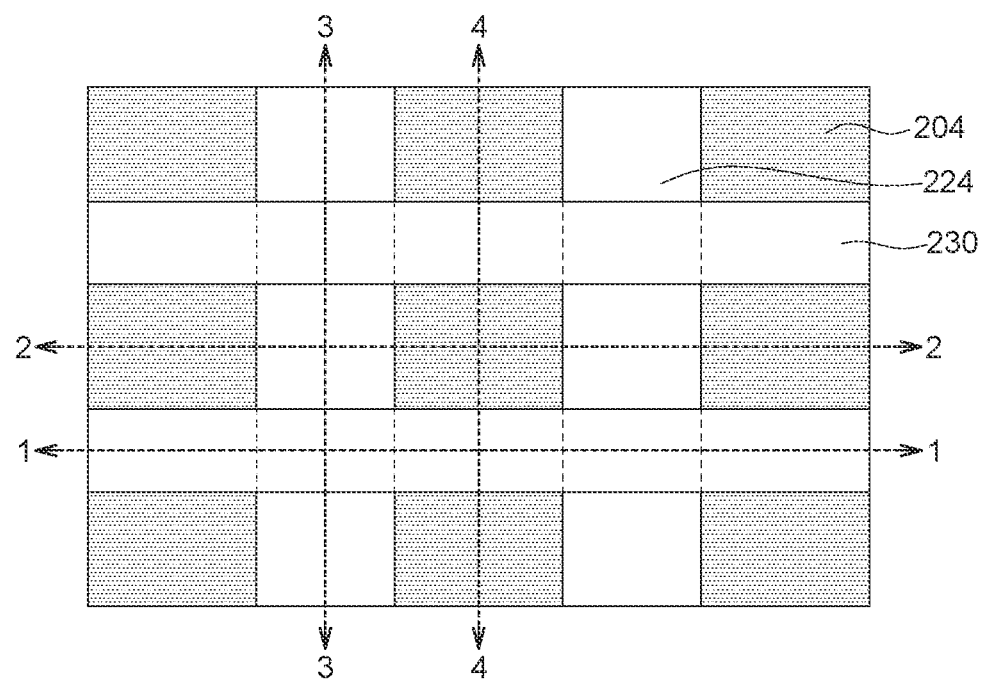
Figure 14C:
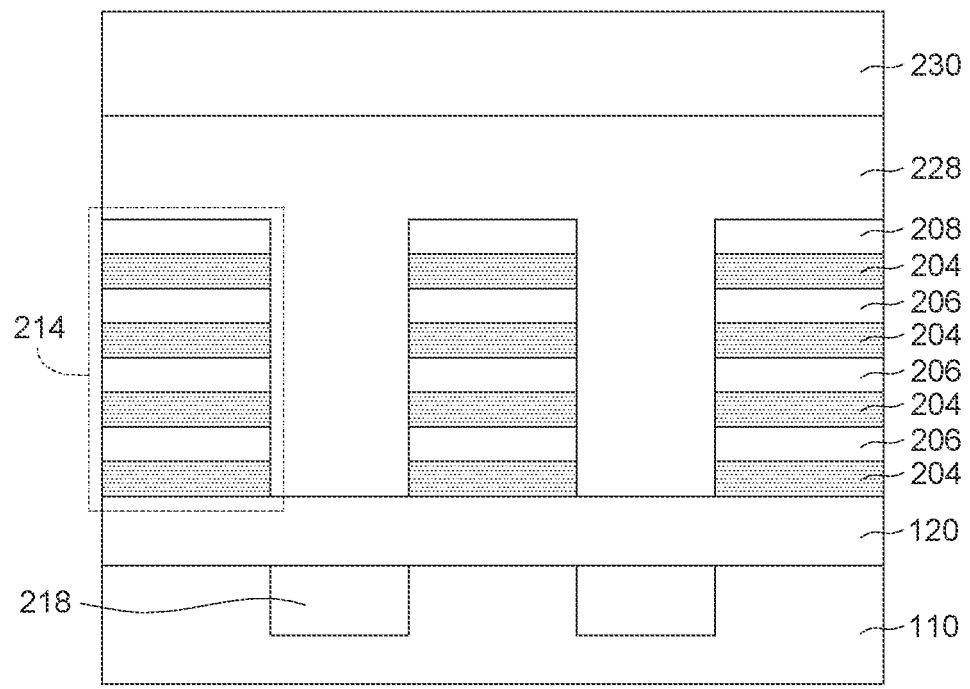
Figure 14D:
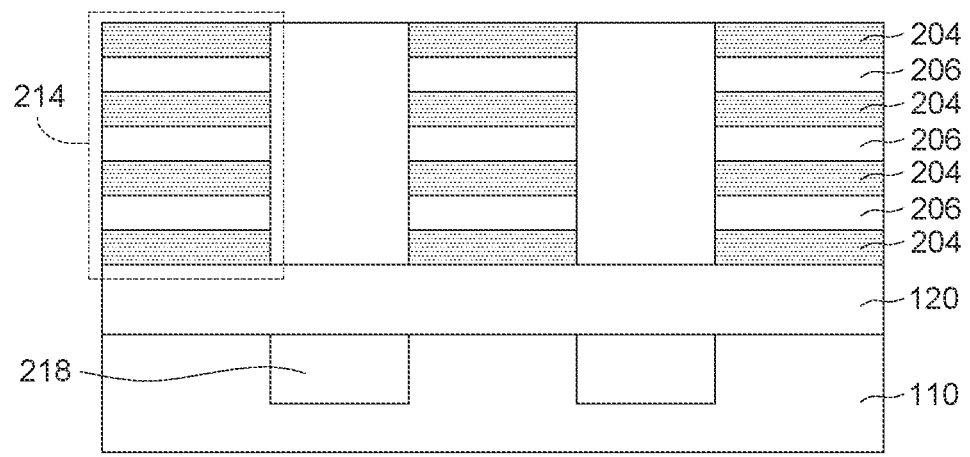
Figure 14E:
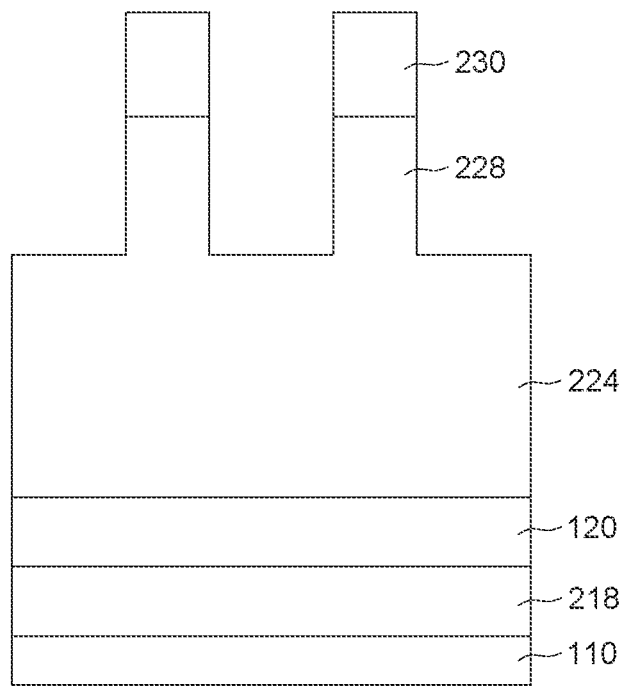
Figure 14F:
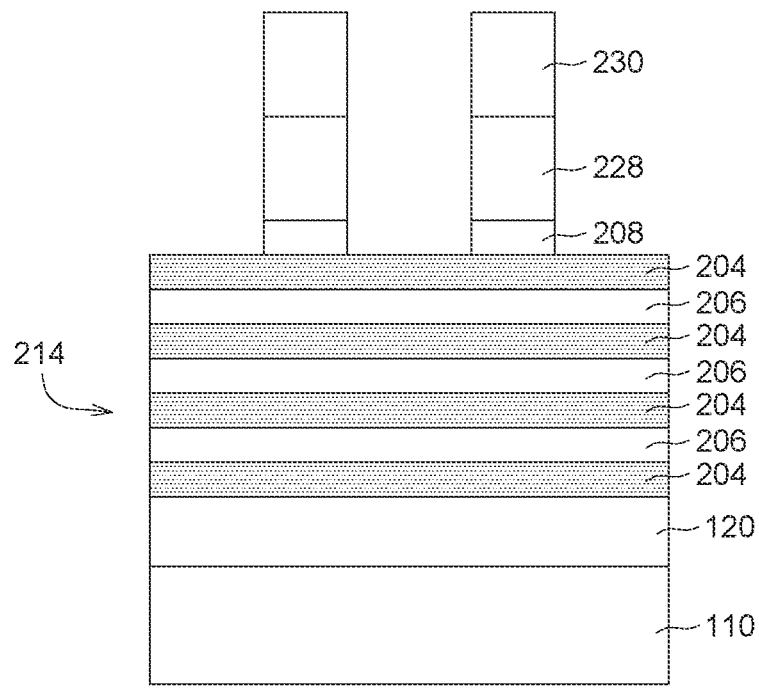

FIGS. 14A-14F illustrates a following structure, wherein FIG. 14A is a perspective view, FIG. 14B is a top view, FIG. 14O is a cross-sectional view of line 1-1 in FIG. 14B, FIG. 14D is a cross-sectional view of line 2-2 in FIG. 14B, FIG. 14E is a cross-sectional view of line 3-3 in FIG. 14B, and FIG. 14F is a cross-sectional view of line 4-4 in FIG. 14B. As shown in FIGS. 14A-14F, the hard mask material 226 and the dummy gate material 224 are patterned. Thereby, a plurality of dummy gates 228 across the preliminary stacks 214 with hard masks 230 thereon are formed. The hard mask material 226 and the dummy gate material 224 may be patterned by a RIE process, but the disclosure is not limited thereto.

Figure 15A:
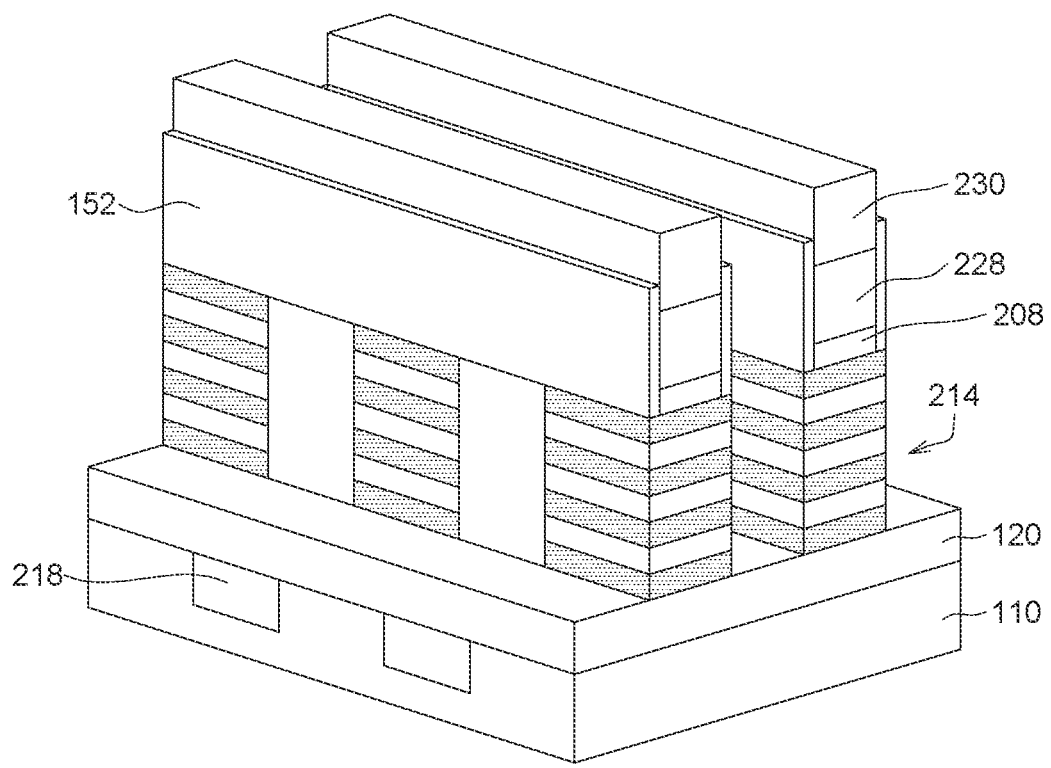
Figure 15B:
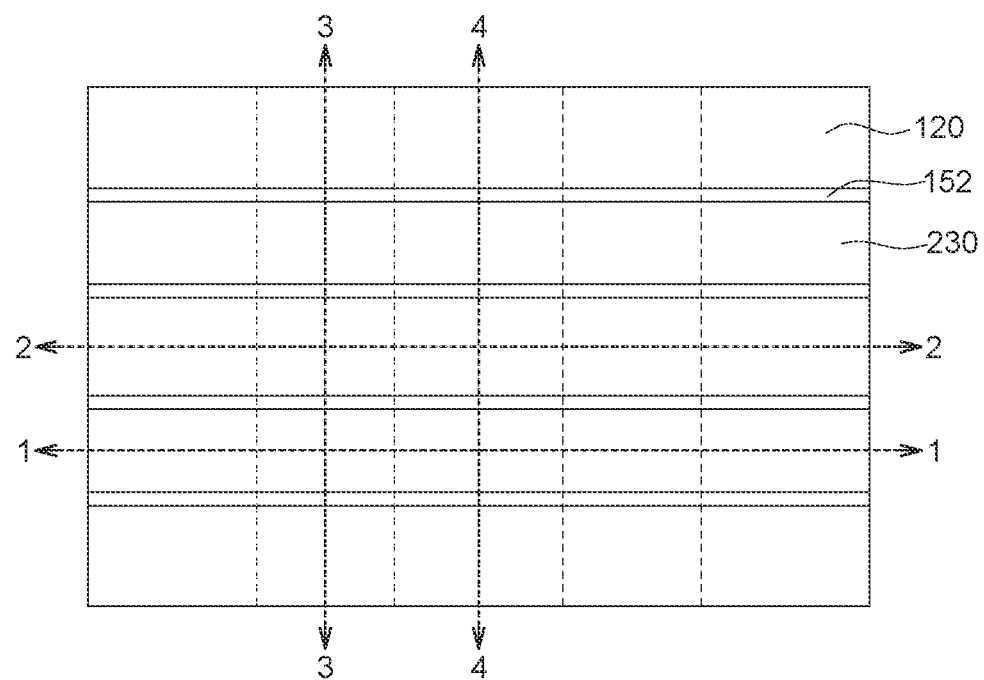
Figure 15C:
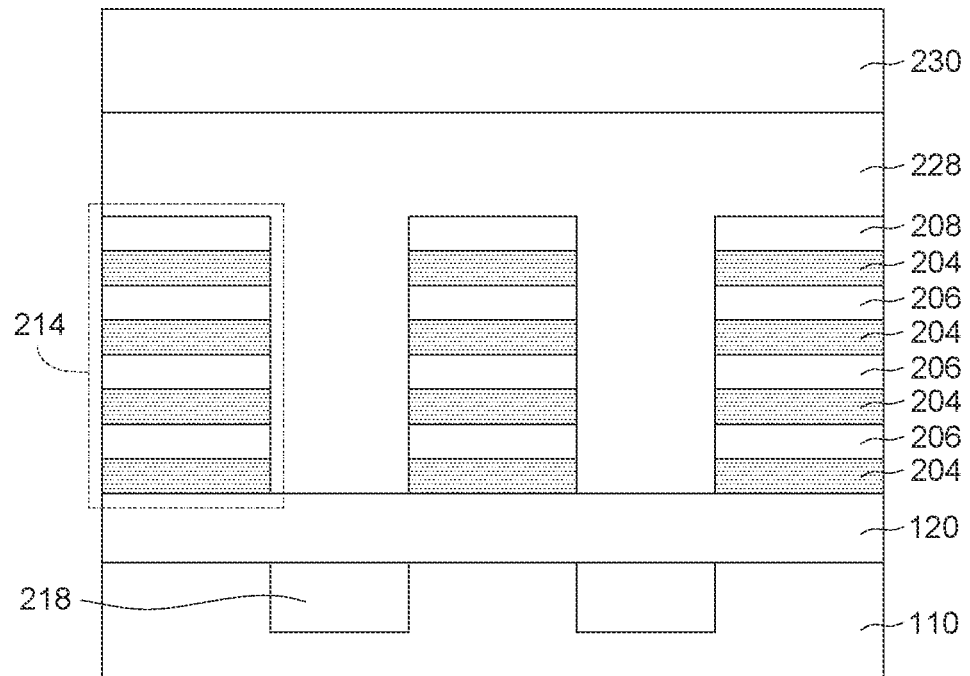
Figure 15D:
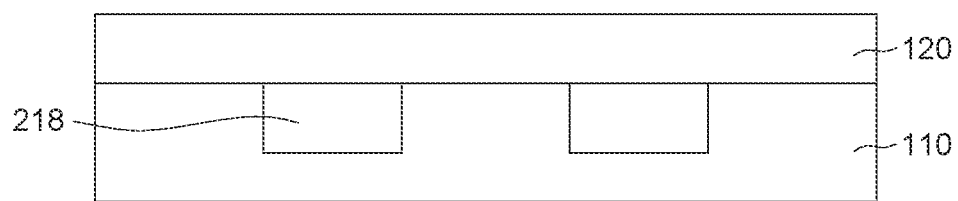
Figure 15E:
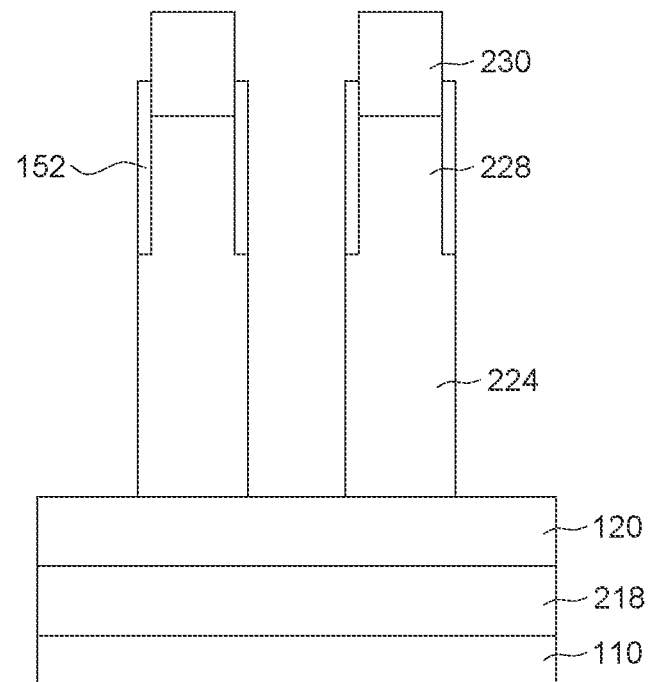
Figure 15F:
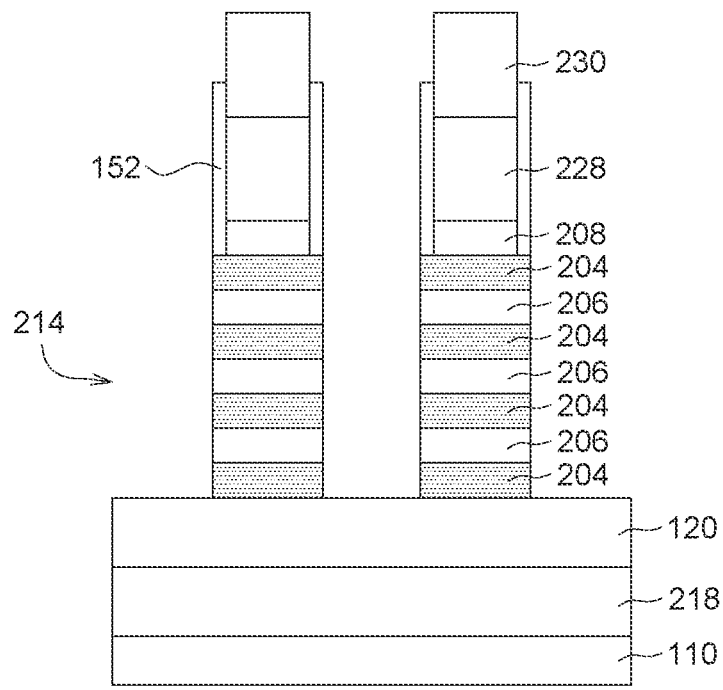

FIGS. 15A-15F illustrates a following structure, wherein FIG. 15A is a perspective view, FIG. 15B is a top view, FIG. 15O is a cross-sectional view of line 1-1 in FIG. 15B, FIG. 15D is a cross-sectional view of line 2-2 in FIG. 15B, FIG. 15E is a cross-sectional view of line 3-3 in FIG. 15B, and FIG. 15F is a cross-sectional view of line 4-4 in FIG. 15B. As shown in FIGS. 15A-15F, outer spacers 152 may be formed on sidewalls of the dummy gates 228 with the hard masks 230 thereon. The outer spacers 152 may be formed by a deposition process and a RIE process, but the disclosure is not limited thereto. Then, portions of the preliminary stacks 214 and portions of the dummy gate material 224 are removed using the hard masks 230 and the outer spacers 152. Thereby, each of the preliminary stacks 214 is divided. This may be conducted by a RIE process, but the disclosure is not limited thereto.

Figure 16A:
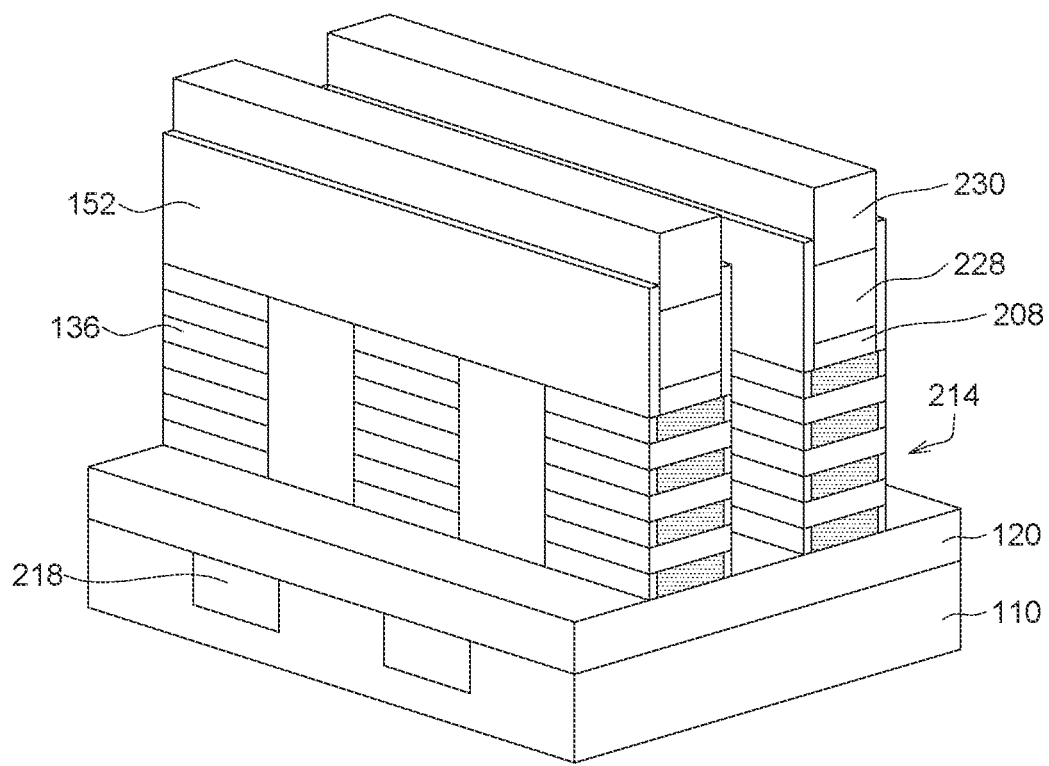
Figure 16B:
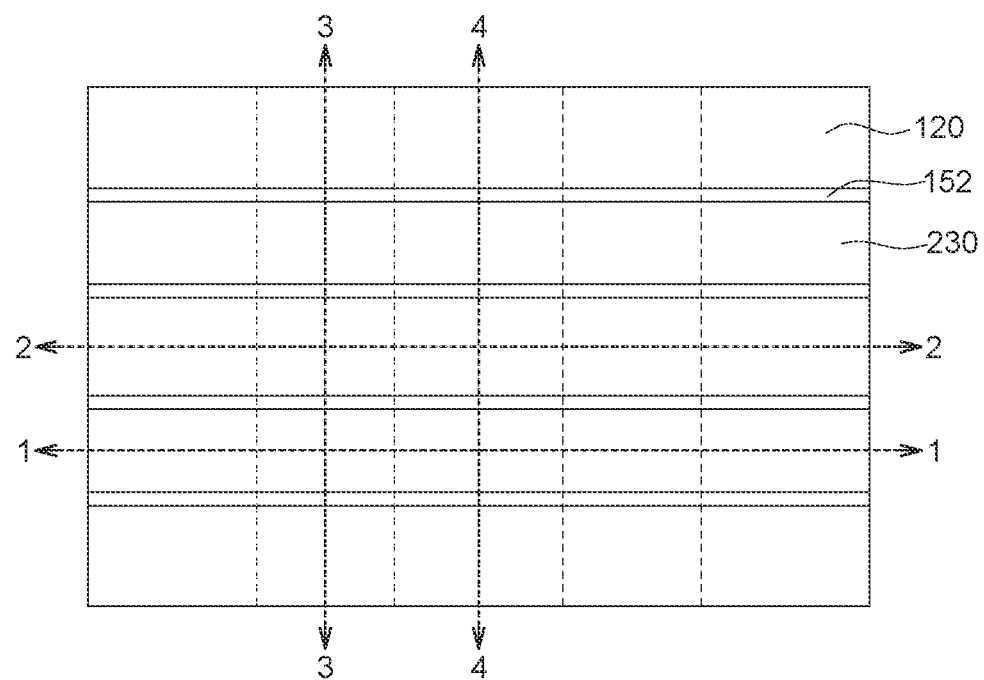
Figure 16C:
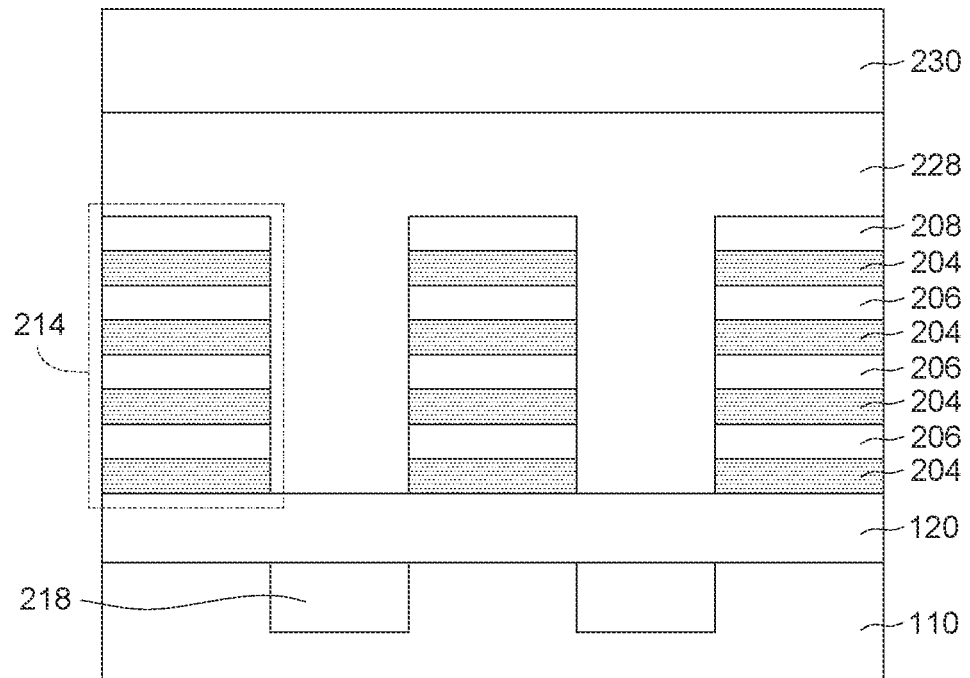
Figure 16D:
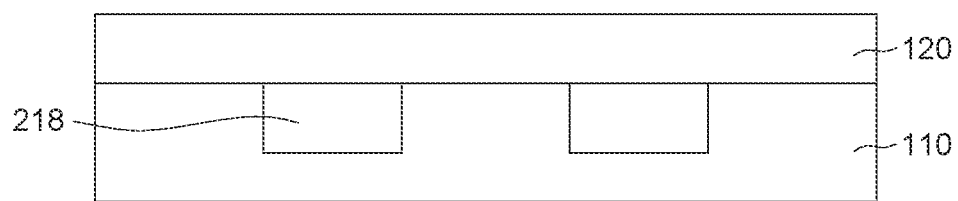
Figure 16E:
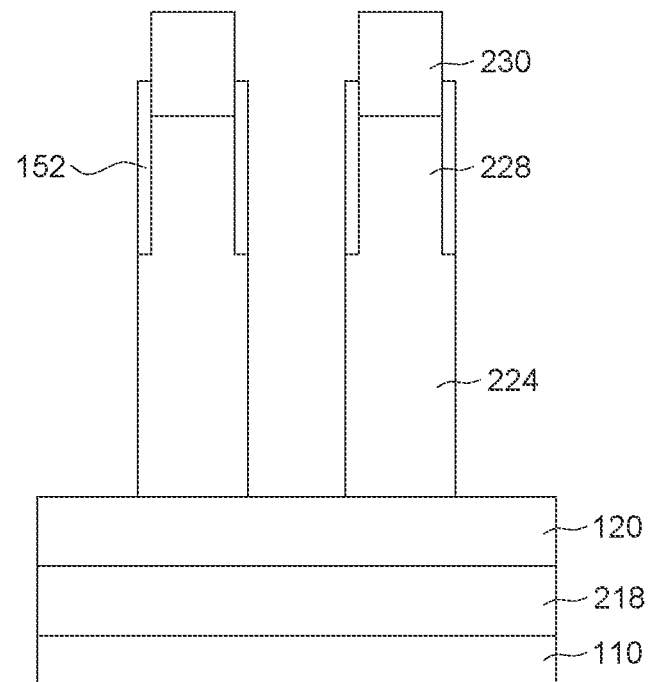
Figure 16F:
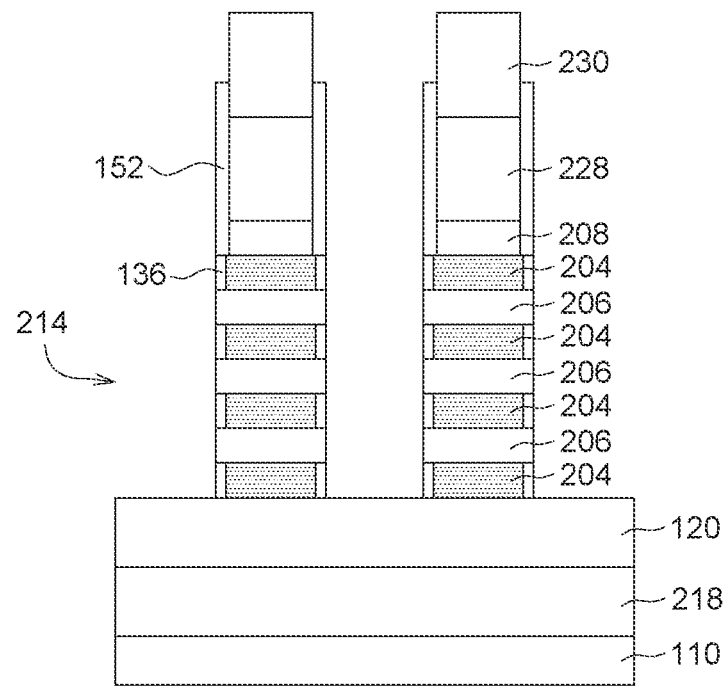

FIGS. 16A-16F illustrates a following structure, wherein FIG. 16A is a perspective view, FIG. 16B is a top view, FIG. 16O is a cross-sectional view of line 1-1 in FIG. 16B, FIG. 16D is a cross-sectional view of line 2-2 in FIG. 16B, FIG. 16E is a cross-sectional view of line 3-3 in FIG. 16B, and FIG. 16F is a cross-sectional view of line 4-4 in FIG. 16B. As shown in FIGS. 16A-16F, a pull back process may be conducted to the sacrificial layers 204. The pull back process may be conducted by isotropical RIE, but the disclosure is not limited thereto. Inner spacers 136 may be formed in spaces caused by the pull back process. The inner spacers 136 may be formed by a deposition process and a RIE process, but the disclosure is not limited thereto.

Figure 17A:
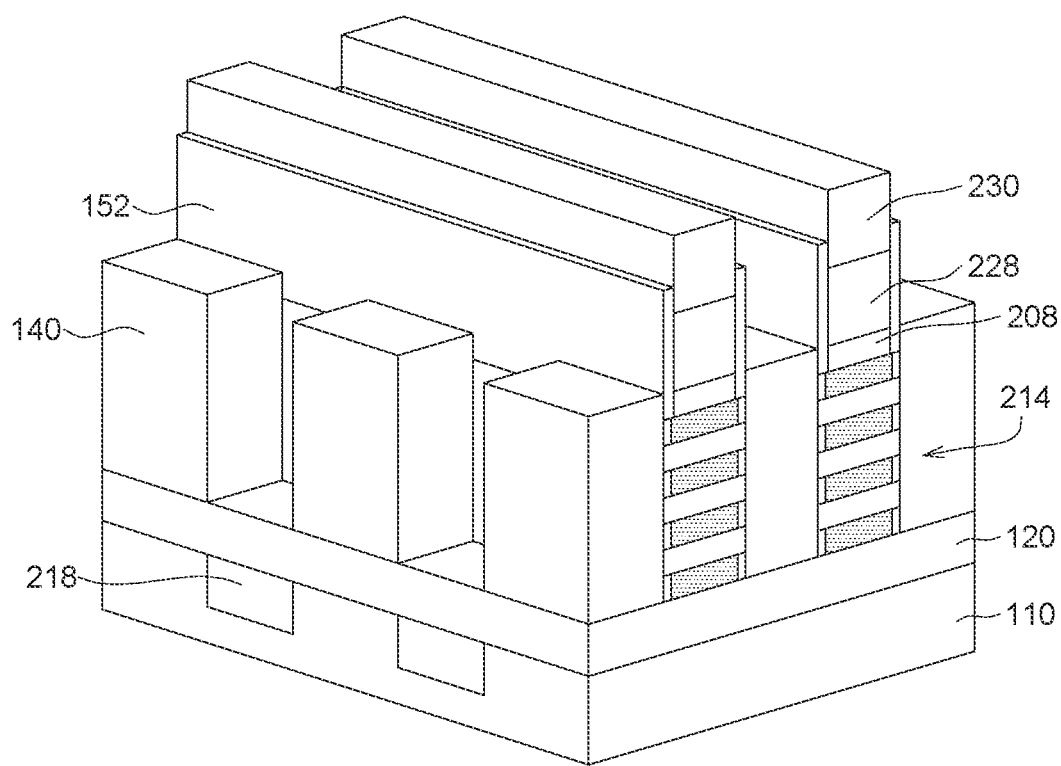
Figure 17B:
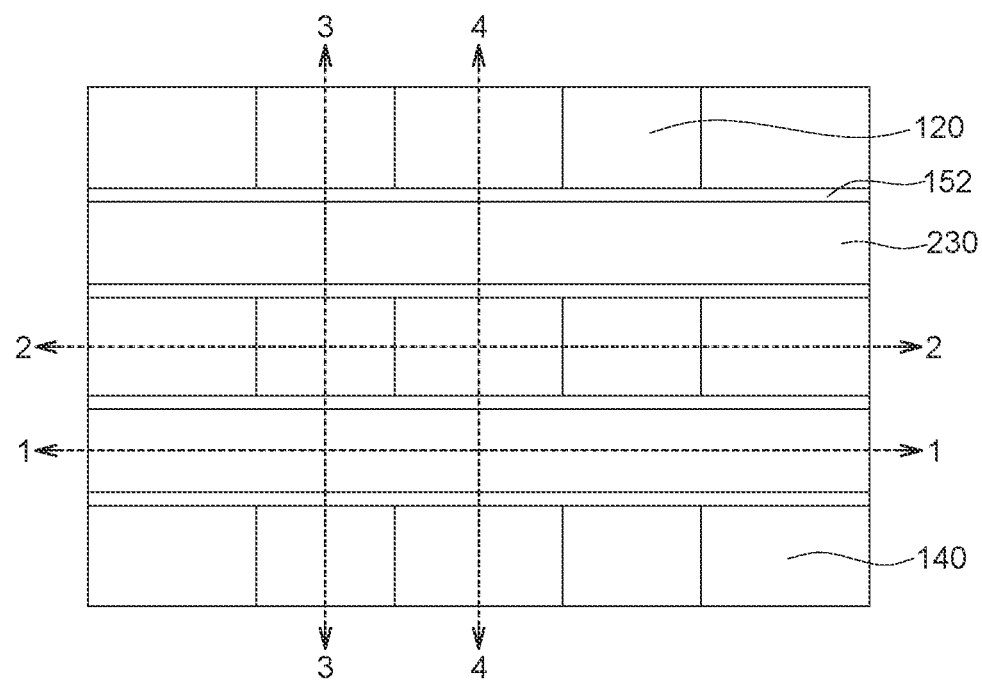
Figure 17C:
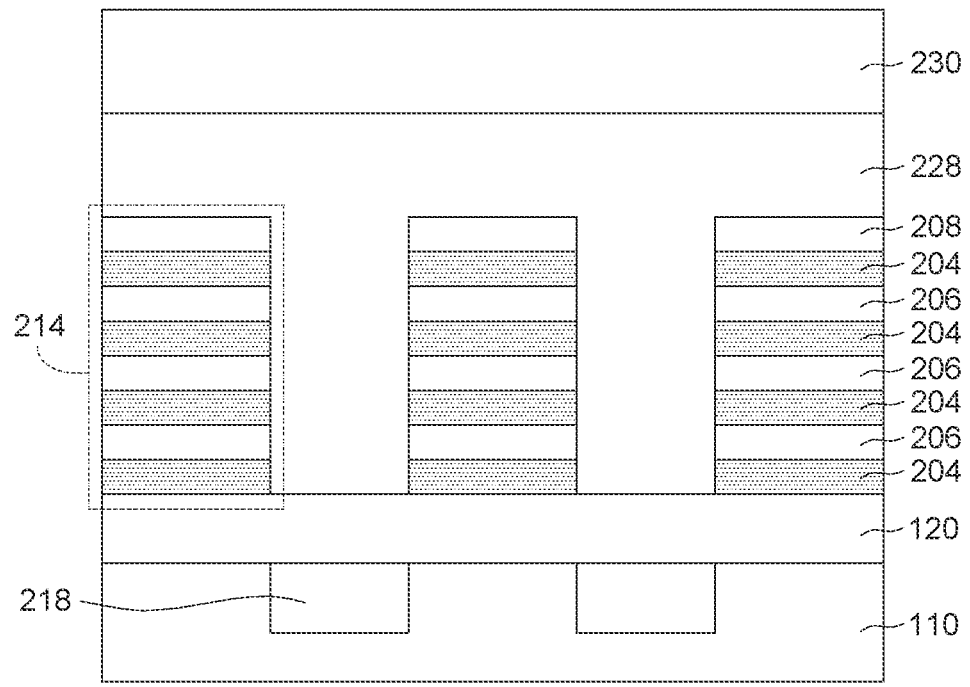
Figure 17D:
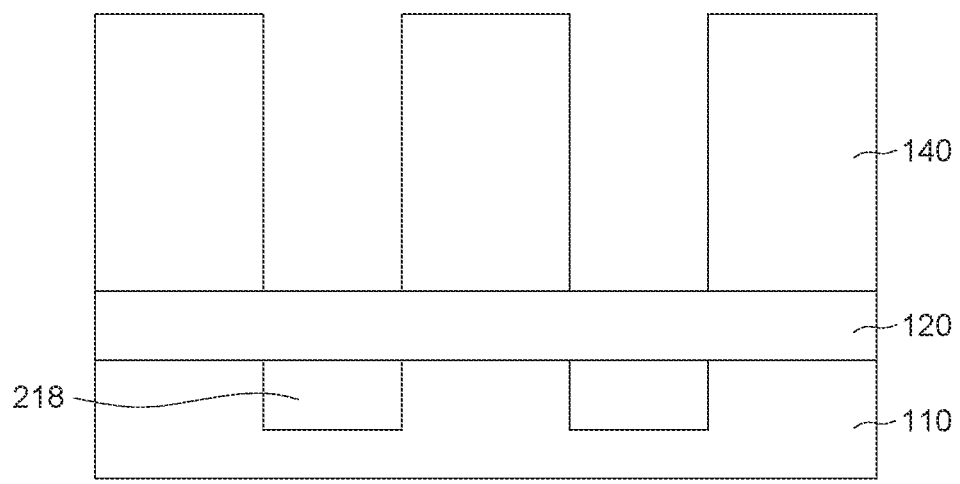
Figure 17E:
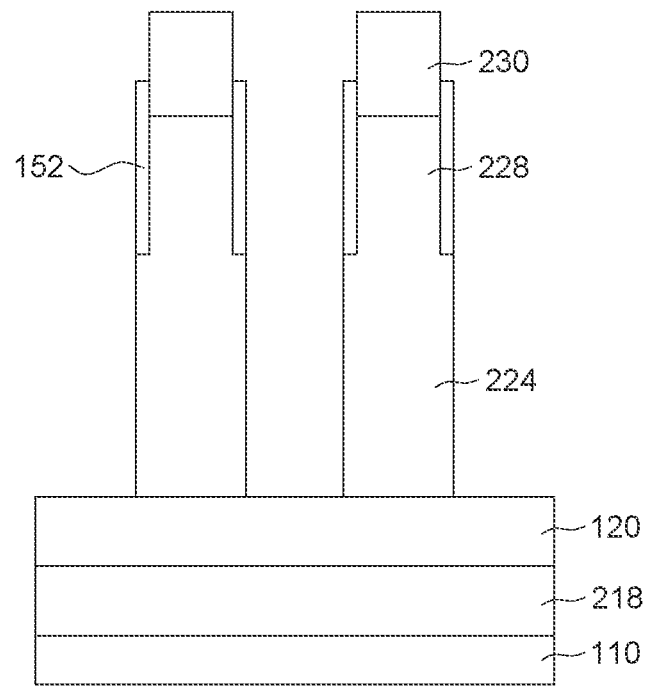
Figure 17F:
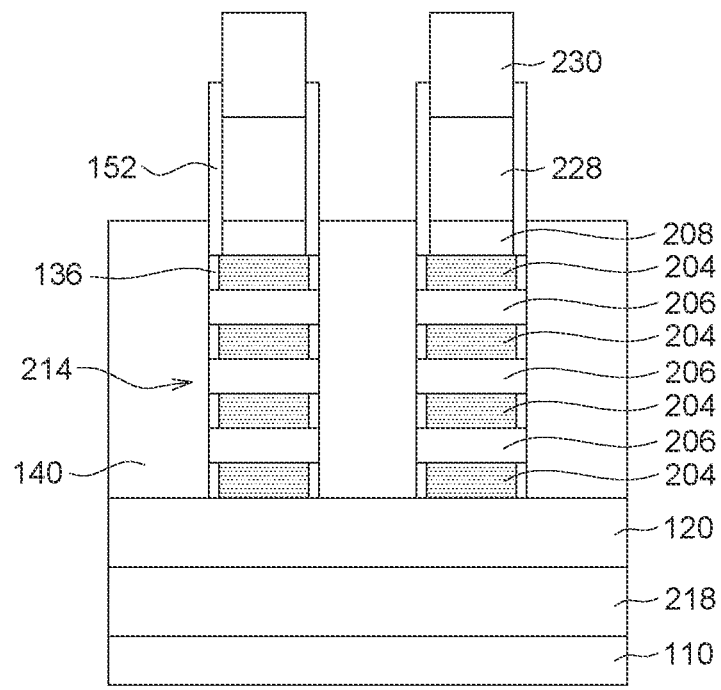

FIGS. 17A-17F illustrates a following structure, wherein FIG. 17A is a perspective view, FIG. 17B is a top view, FIG. 17C is a cross-sectional view of line 1-1 in FIG. 17B, FIG. 17D is a cross-sectional view of line 2-2 in FIG. 17B, FIG. 17E is a cross-sectional view of line 3-3 in FIG. 17B, and FIG. 17F is a cross-sectional view of line 4-4 in FIG. 17B. As shown in FIGS. 17A-17F, a plurality of source/drain structures 140 are formed on the bottom dielectric layer 120 at spaces caused by dividing each of the preliminary stacks 214. The source/drain structures 140 may be formed by a selective epitaxial growth (SEG) process, but the disclosure is not limited thereto. In some cases, the adjacent source/drain structures 140 may be connected together, and they will be coupled together to the same contact. According to some embodiments, a number of the source/drain structures 140 in each row along an extending direction of the dummy gates 228 may correspond to a number of the preliminary stacks 214 connected by one dummy gate 228. The number of the source/drain structures 140 in each row may be two or more.

Figure 18A:
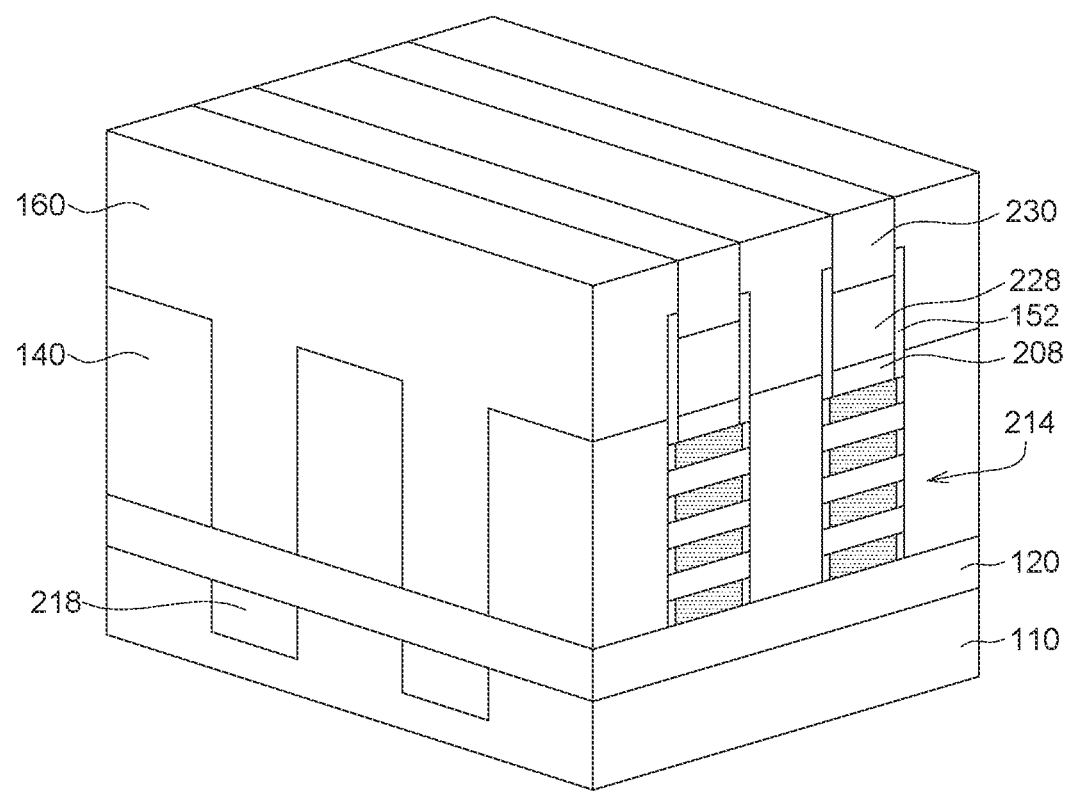
Figure 18B:
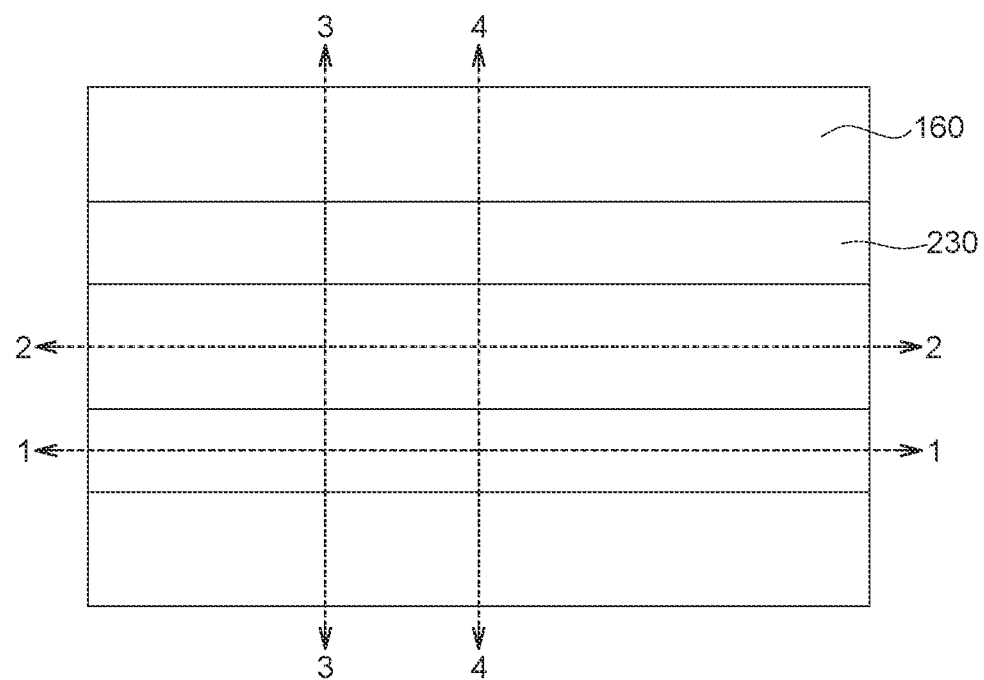
Figure 18C:
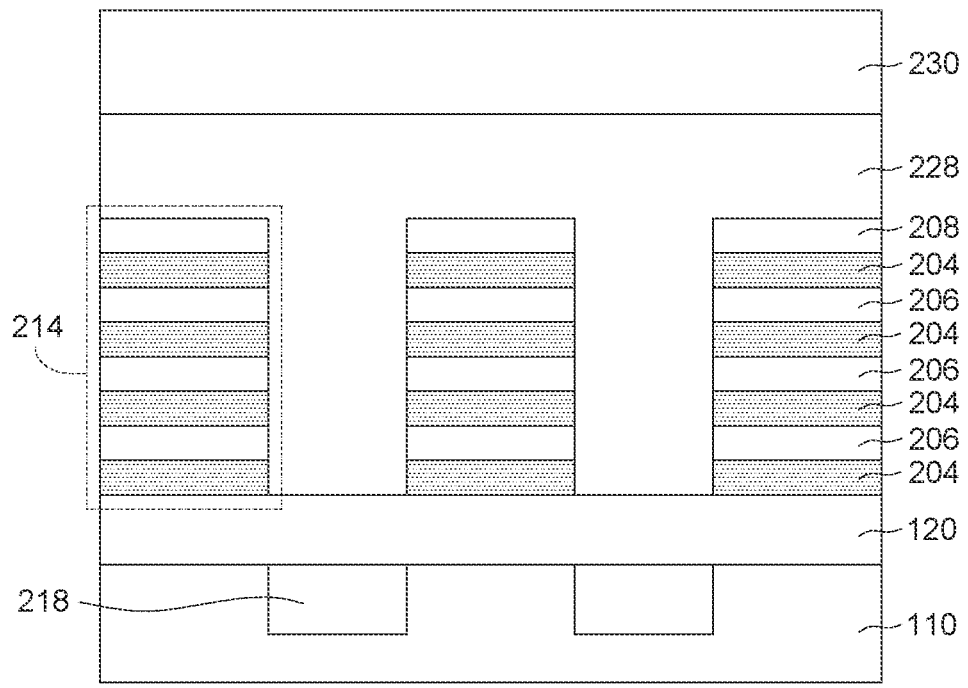
Figure 18D:
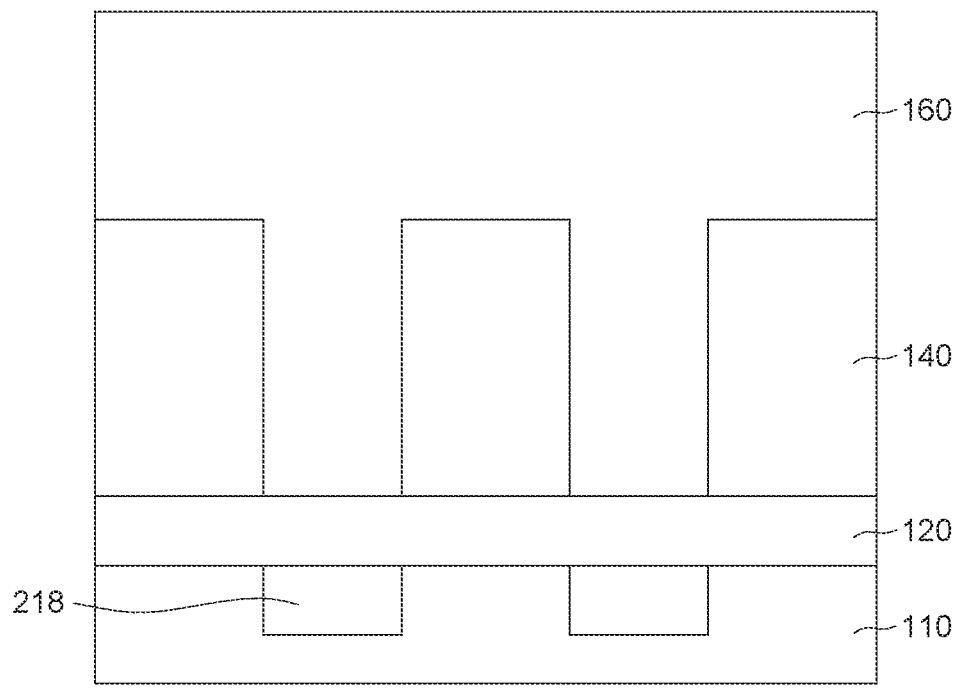
Figure 18E:
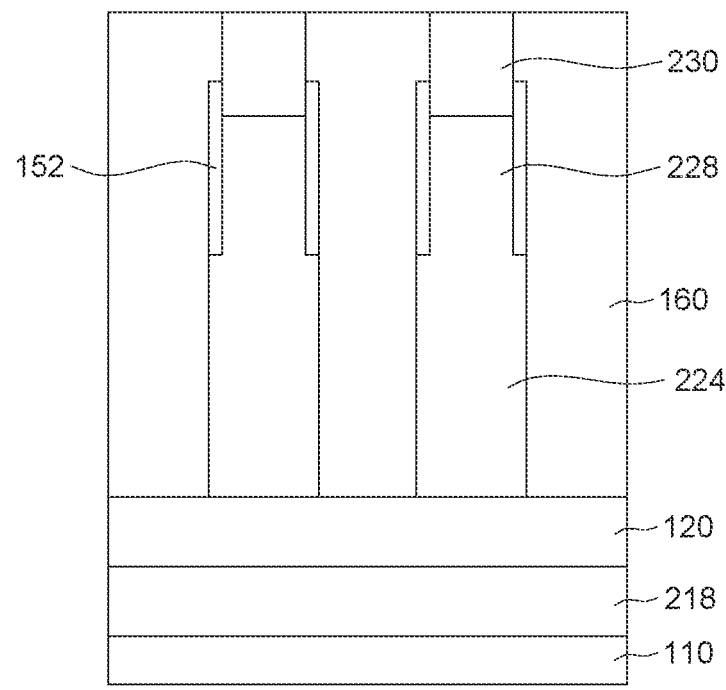
Figure 18F:
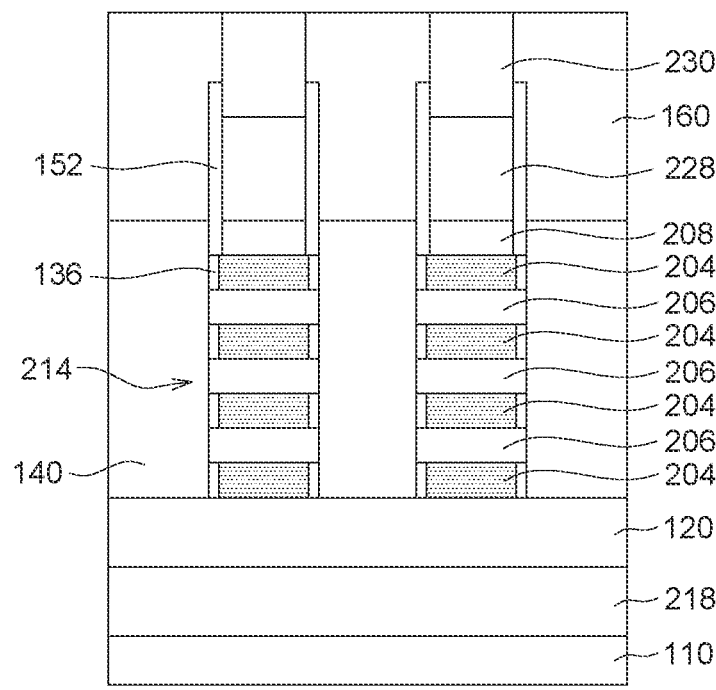

FIGS. 18A-18F illustrates a following structure, wherein FIG. 18A is a perspective view, FIG. 18B is a top view, FIG. 18C is a cross-sectional view of line 1-1 in FIG. 18B, FIG. 18D is a cross-sectional view of line 2-2 in FIG. 18B, FIG. 18E is a cross-sectional view of line 3-3 in FIG. 18B, and FIG. 18F is a cross-sectional view of line 4-4 in FIG. 18B. As shown in FIGS. 18A-18F, a dielectric material 160 is filled. A typical interlayer dielectric material may be used. This process may be conducted by a deposition process and a CMP process stopped on the hard masks 230, but the disclosure is not limited thereto.

Thereafter, the remaining sacrificial layers 204 of the preliminary stacks 214 are replaced with gate electrodes 132 through the steps illustrated in FIGS. 19A-19F to FIGS. 20A-20F Thereby, a plurality of stacks 130 are formed on the bottom dielectric layer 120. Each of the stacks 130 comprises gate electrodes 132 and semiconductor layers 134 disposed alternately. In addition, a plurality of conductors 150 are formed on highest gate electrodes 132 of the stacks 130.

Figure 19A:
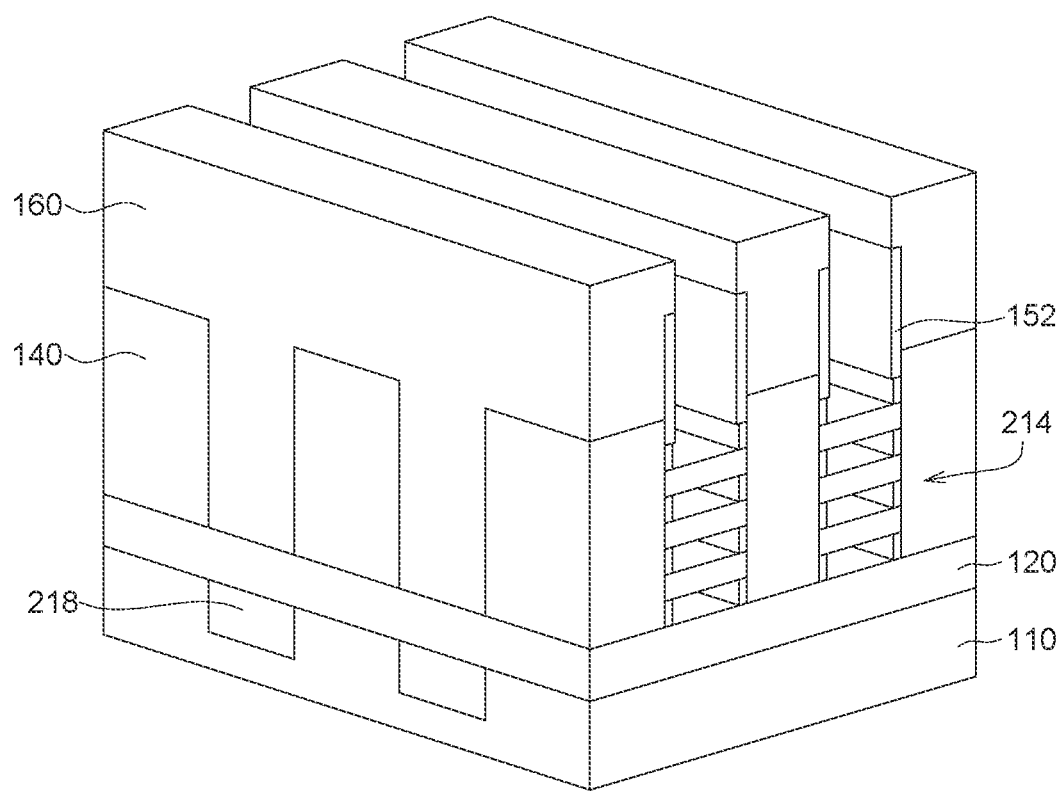
Figure 19B:
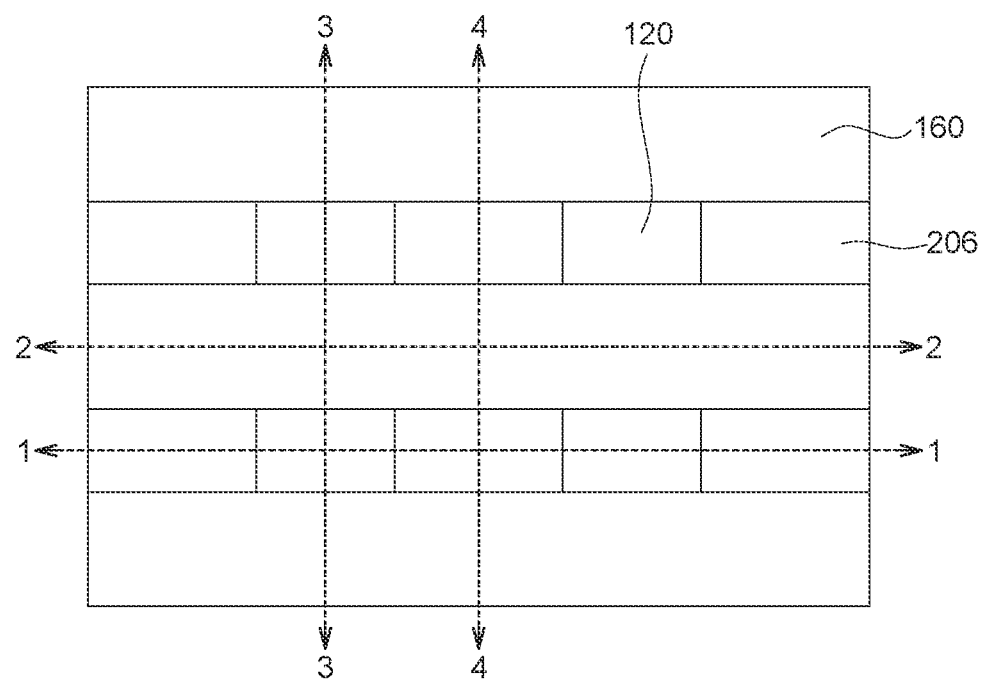
Figure 19C:
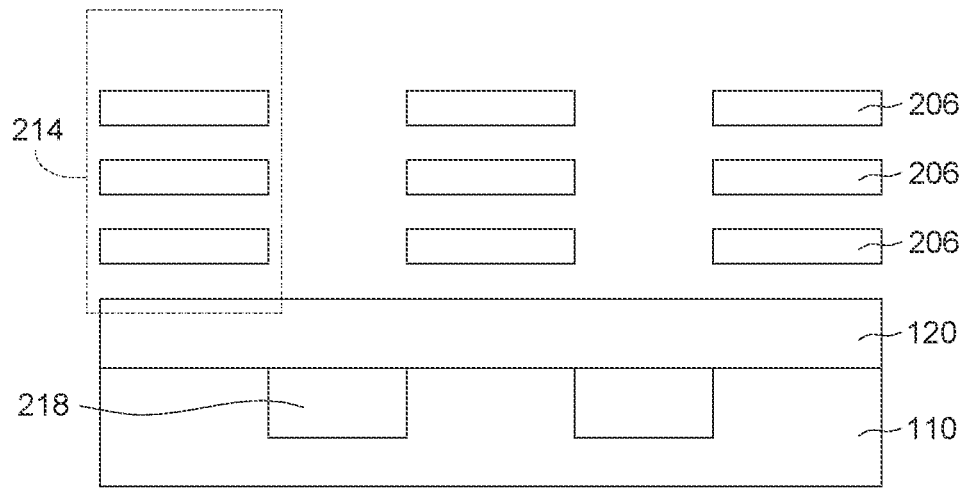
Figure 19D:
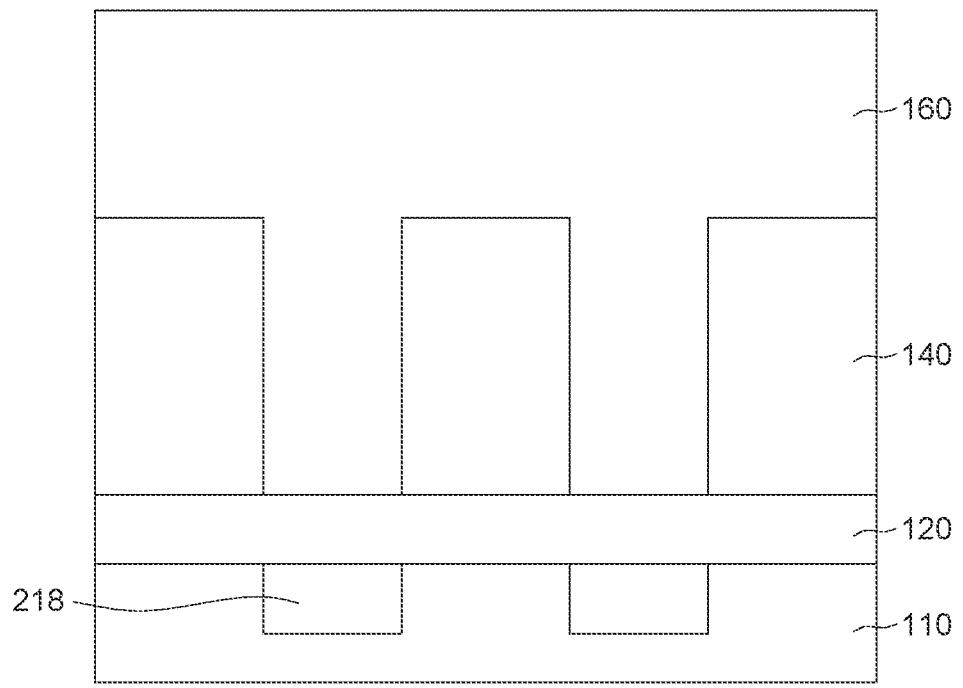
Figure 19E:
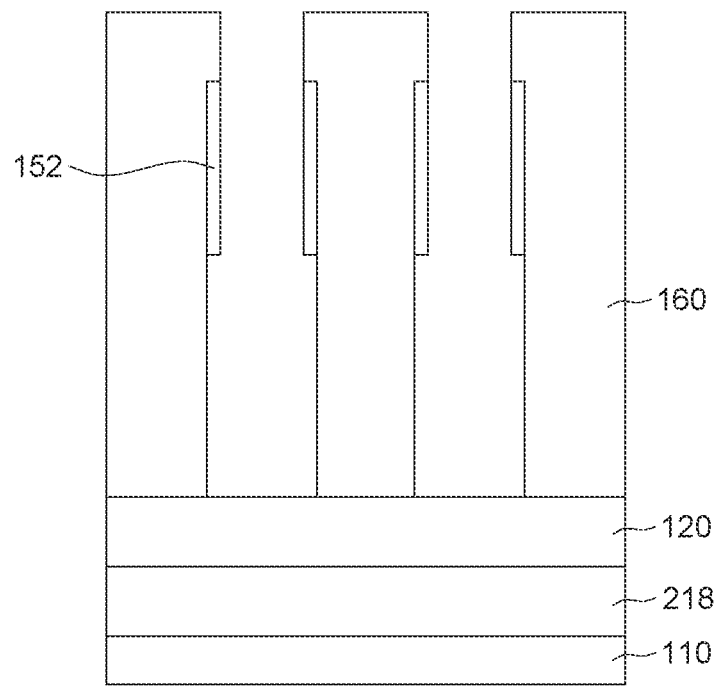
Figure 19F:
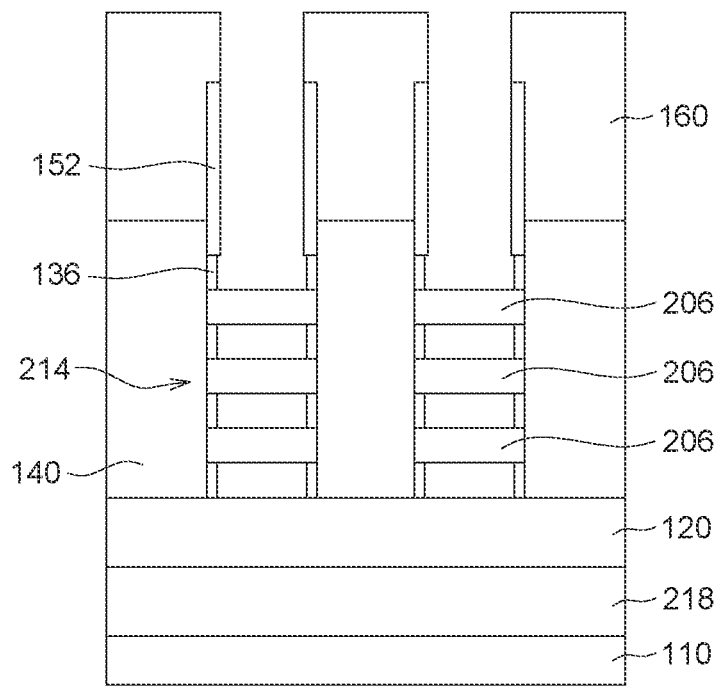

FIGS. 19A-19F illustrates a following structure after FIGS. 18A-18F, wherein FIG. 19A is a perspective view, FIG. 19B is a top view, FIG. 19C is a cross-sectional view of line 1-1 in FIG. 19B, FIG. 19D is a cross-sectional view of line 2-2 in FIG. 19B, FIG. 19E is a cross-sectional view of line 3-3 in FIG. 19B, and FIG. 19F is a cross-sectional view of line 4-4 in FIG. 19B. As shown in FIGS. 19A-19F, the hard masks 230, the dummy gates 228, and the remaining sacrificial layers 204 of the preliminary stacks 214 are removed.

Figure 20A:
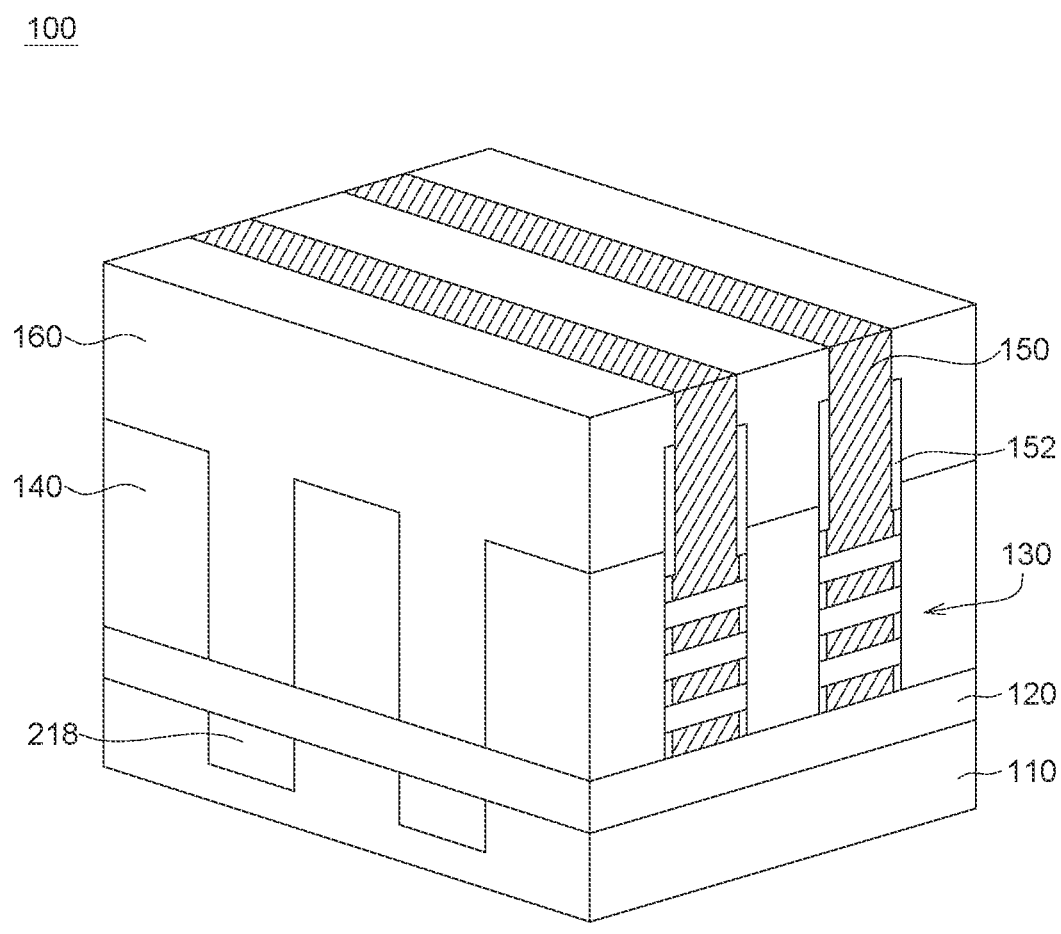
Figure 20B:
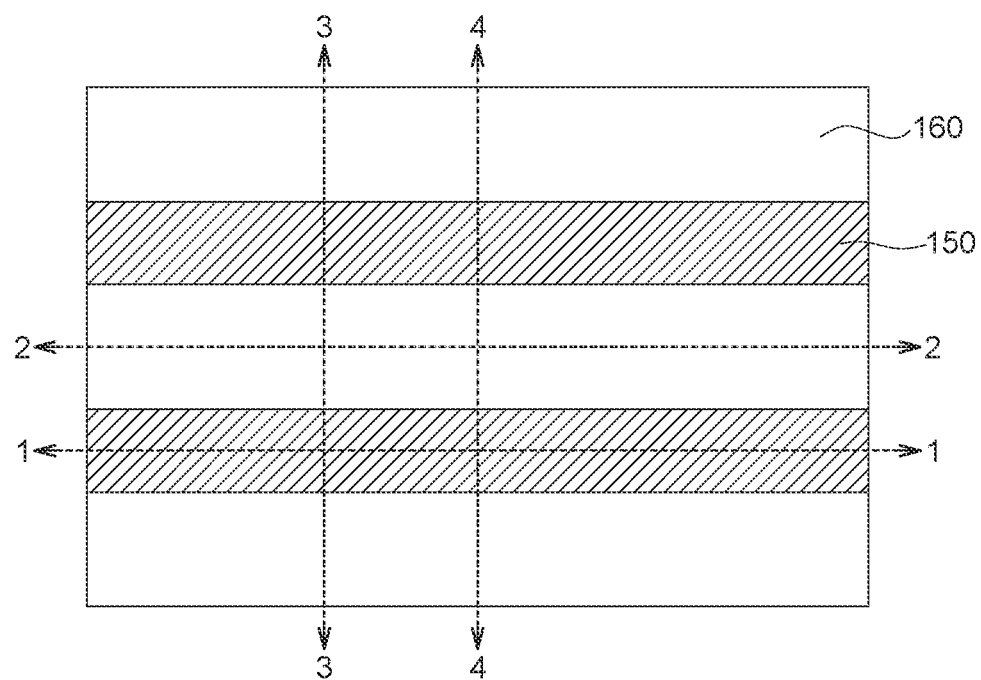
Figure 20C:
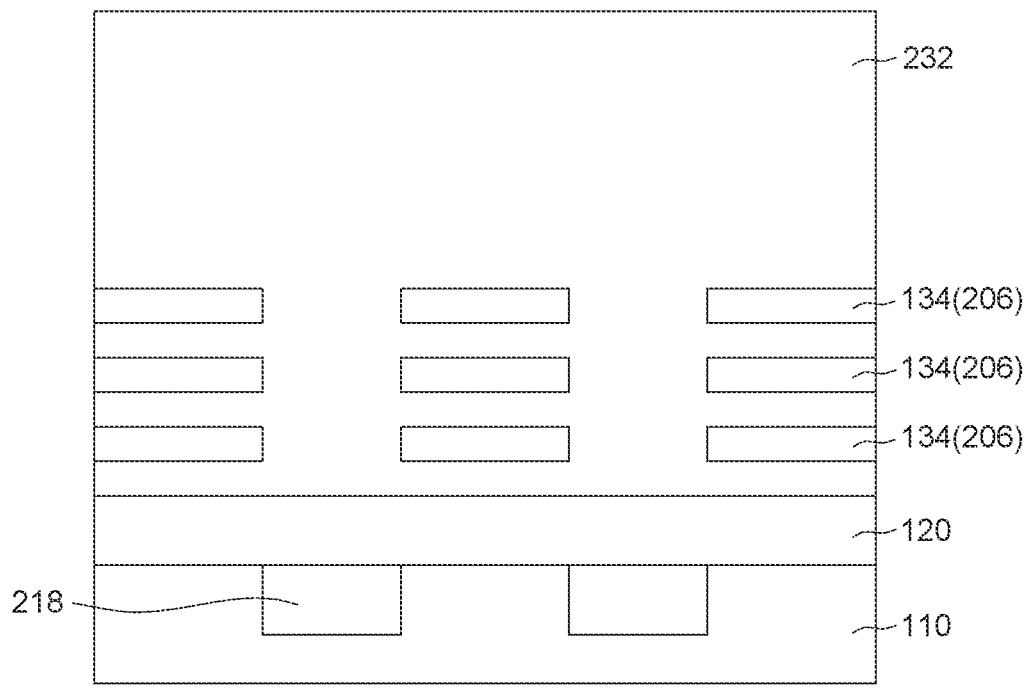
Figure 20D:
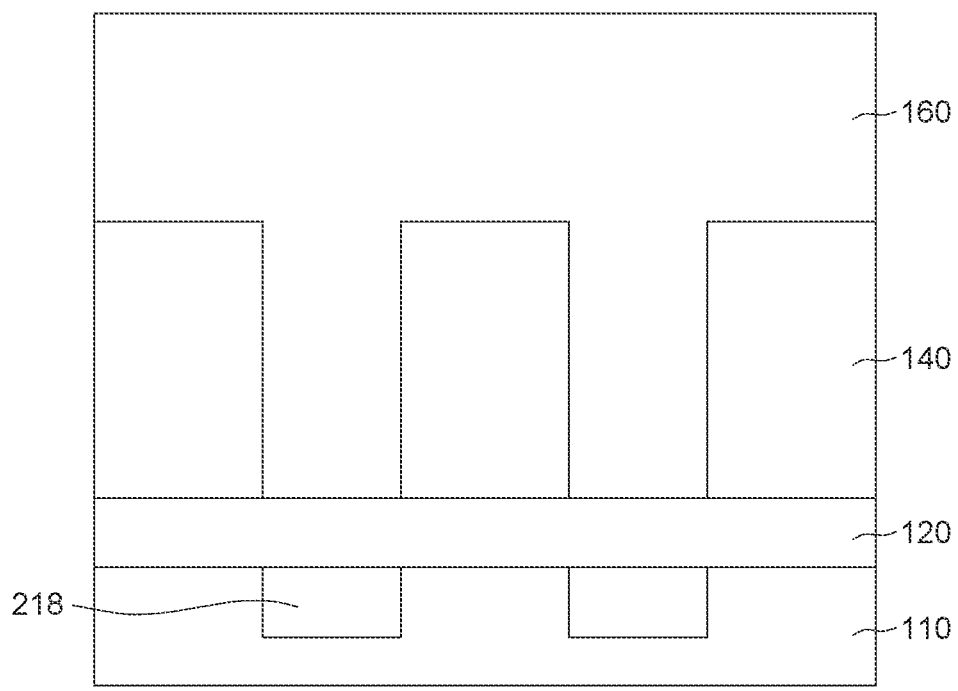
Figure 20E:
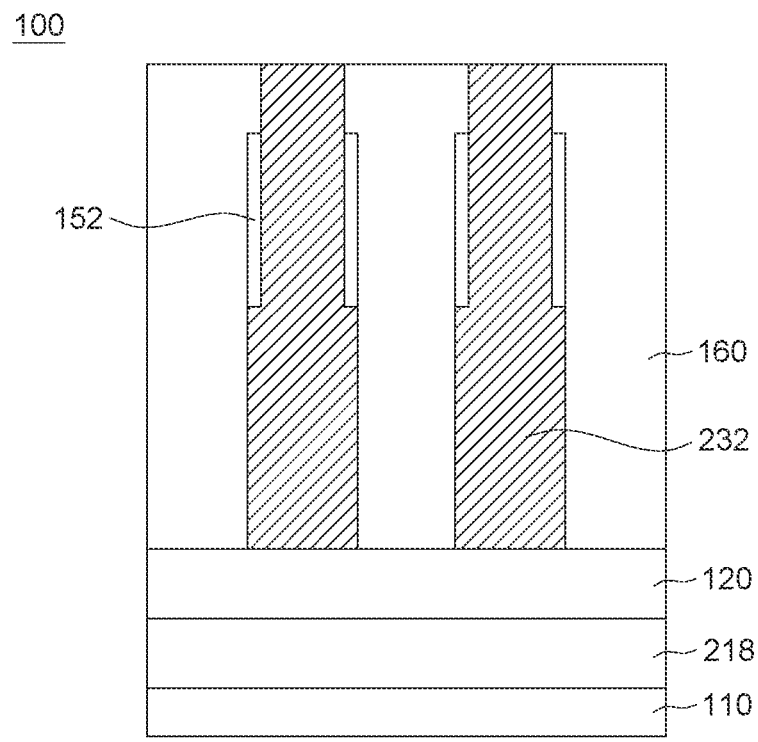
Figure 20F:
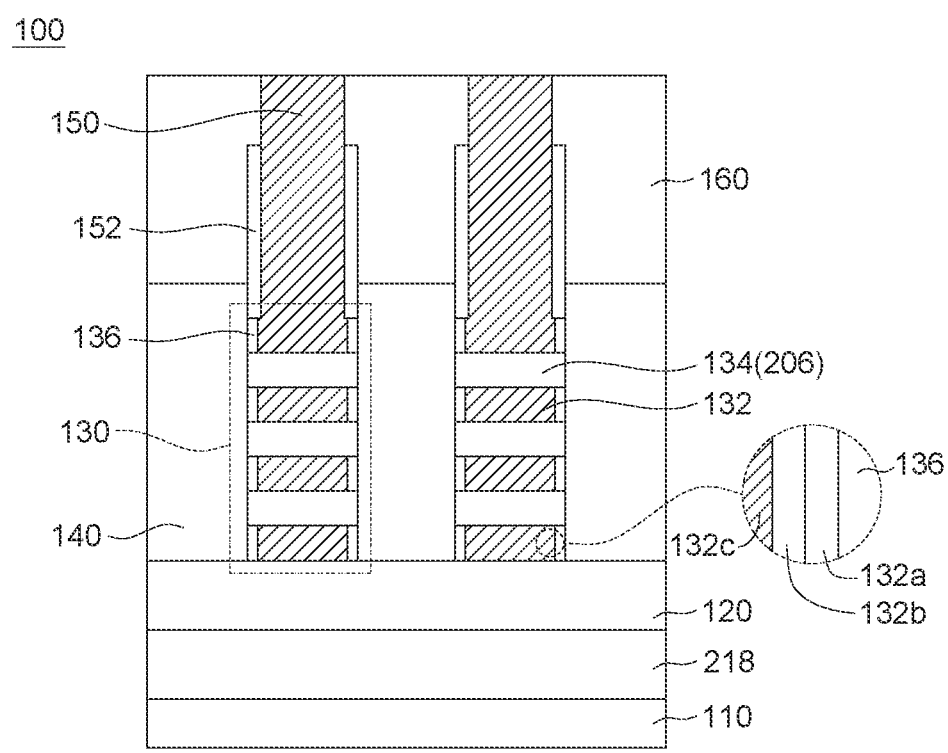

FIGS. 20A-20F illustrates a following structure, wherein FIG. 20A is a perspective view, FIG. 20B is a top view, FIG. 20C is a cross-sectional view of line 1-1 in FIG. 20B FIG. 20D is a cross-sectional view of line 2-2 in FIG. 20B, FIG. 20E is a cross-sectional view of line 3-3 in FIG. 20B, and FIG. 20F is a cross-sectional view of line 4-4 in FIG. 20B. As shown in FIGS. 20A-20F, the gate electrodes 132 are formed in spaces caused by removing the remaining sacrificial layers 204 of the preliminary stacks 214. Thereby, said stacks 130 are formed. In some embodiments, the stacks 130 has a width of 2 nm to 200 nm. In addition, the conductors 150 are formed in spaces caused by removing the hard masks and the dummy gates. According to some embodiments, the gate electrodes 132 and the conductors 150 may comprise same materials. In such cases, forming the gate electrodes 132 and forming the conductors 150 can be finished at a common process. For example, a conformal layer of a buffered oxide 132a may be formed at first. Then, the common process is conducted. The common process comprises forming a conformal layer of a high k material 132b and filling a metal gate material 132c, and optionally comprises a CMP process for the high k material 132b and the metal gate material 132c. In some embodiments, as shown in FIGS. 20A-20F, a horizontal size of the conductors 150 as formed is smaller a horizontal size of the gate electrodes 132 as formed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a substrate;
   a bottom dielectric layer continuously disposed on the substrate;
   a plurality of stacks disposed on the bottom dielectric layer, each of the stacks comprising gate electrodes and semiconductor layers disposed alternately;
   a plurality of source/drain structures disposed on the bottom dielectric layer and between the stacks; and
   a plurality of conductors landed on highest gate electrodes of the stacks;
   wherein an extending direction of the conductors is perpendicular to a direction directing from one of the source/drain structures disposed at a side of one of the stacks to corresponding one of the source/drain structures disposed at another side of the one of the stacks opposite to said side, wherein the bottom dielectric layer has thicker portions between the stacks along the extending direction of the conductors, and wherein the bottom dielectric layer has a continuous co-planar top surface.

2. The semiconductor structure according to claim 1, wherein each of the stacks further comprising inner spacers disposed on sidewalls of the gate electrodes.

3. The semiconductor structure according to claim 1, wherein the gate electrodes comprise a high k material and a metal gate material.

4. The semiconductor structure according to claim 1, wherein the conductors comprise same materials as the gate electrodes.

5. The semiconductor structure according to claim 1, wherein a horizontal size of the conductors is smaller a horizontal size of the gate electrodes.

6. The semiconductor structure according to claim 1, further comprising:
   outer spacers disposed on sidewalls of the conductors.

7. The semiconductor structure according to claim 1, wherein each of the conductors electrically connects two or more of the stacks in the extending direction of the conductors, and a number of the source/drain structures in each row along the extending direction of the conductors corresponds to a number of the stacks electrically connected by one conductor.

8. The semiconductor structure according to claim 1, wherein the bottom dielectric layer has a thickness of 5 nm to 100 nm.

9. The semiconductor structure according to claim 1, wherein the stacks has a width of 2 nm to 200 nm.

10. A method for manufacturing a semiconductor structure, comprising:
    providing a substrate;
    forming a bottom dielectric layer continuous on the substrate;
    forming a plurality of stacks on the bottom dielectric layer, each of the stacks comprising gate electrodes and semiconductor layers disposed alternately;
    forming a plurality of source/drain structures on the bottom dielectric layer and between the stacks; and
    forming a plurality of conductors on highest gate electrodes of the stacks;
    wherein an extending direction of the conductors is perpendicular to a direction directing from one of the source/drain structures disposed at a side of one of the stacks to corresponding one of the source/drain structures disposed at another side of the one of the stacks opposite to said side, wherein the bottom dielectric layer has thicker portions between the stacks along the extending direction of the conductors, and wherein the bottom dielectric layer has a continuous co-planar top surface.

11. The method according to claim 10, comprising:
    forming a plurality of preliminary stacks on the substrate, the preliminary stacks separated by a plurality of trenches, each of the preliminary stacks comprising sacrificial layers and semiconductor layers disposed alternately;
    removing lowest sacrificial layers and lowest semiconductor layers of the preliminary stacks;
    providing a bottom dielectric material which is provided to the trenches and further fills into spaces caused by removing the lowest sacrificial layers and the lowest semiconductor layers, so as to form the bottom dielectric layer;
    dividing each of the preliminary stacks;
    forming the source/drain structures on the bottom dielectric layer at spaces caused by dividing each of the preliminary stacks; and
    replacing the remaining sacrificial layers of the preliminary stacks with gate electrodes, so as to form the stacks on the bottom dielectric layer.

12. The method according to claim 11, wherein the lowest sacrificial layers of the preliminary stacks are disposed on the substrate, and the lowest semiconductor layers of the preliminary stacks are disposed on the lowest sacrificial layers, and wherein removing the lowest sacrificial layers and the lowest semiconductor layers of the preliminary stacks comprises:
    forming barriers into the trenches, wherein the barriers have top surfaces aligned with top surfaces of the lowest sacrificial layers;
    forming disposable spacers on sidewalls of the preliminary stacks, the disposable spacers stopping on the top surfaces of the barriers;
    removing portions of the barriers covering the lowest sacrificial layers;
    conducting a first selective etching process to remove the lowest sacrificial layers; and
    conducting a second selective etching process to remove the lowest semiconductor layers.

13. The method according to claim 11, after forming the bottom dielectric layer and before forming the source/drain structures, the method comprising:
    providing a dummy gate material which fills into the trenches and covers the preliminary stacks;
    providing a hard mask material onto the dummy gate material;
    patterning the hard mask material and the dummy gate material, so as to form a plurality of dummy gates across the preliminary stacks with hard masks thereon;
    forming outer spacers on sidewalls of the dummy gates with the hard masks thereon; and
    removing portions of the preliminary stacks and portions of the dummy gate material using the hard masks and the outer spacers, so as to dividing each of the preliminary stacks.

14. The method according to claim 13, further comprising:
    conducting a pull back process to the sacrificial layers; and
    forming inner spacers in spaces caused by the pull back process.

15. The method according to claim 13, wherein in forming the source/drain structures, a number of the source/drain structures in each row along an extending direction of the dummy gates corresponds to a number of the preliminary stacks connected by one dummy gate, and the number of the source/drain structures in each row is two or more.

16. The method according to claim 13, after forming the source/drain structures, the method comprising:
   filling a dielectric material;
   removing the hard masks, the dummy gates, and the remaining sacrificial layers of the preliminary stacks; and
   forming the gate electrodes in spaces caused by removing the remaining sacrificial layers of the preliminary stacks; and
   forming the conductors in spaces caused by removing the hard masks and the dummy gates.

17. The method according to claim 16, wherein the gate electrodes and the conductors comprise same materials, and forming the gate electrodes and forming the conductors are finished at a common process.

18. The method according to claim 17, the common process comprises:
   forming a conformal layer of a high k material; and
   filling a metal gate material.

19. The method according to claim 11, wherein a horizontal size of the conductors as formed is smaller a horizontal size of the gate electrodes as formed.

20. The method according to claim 11, wherein the bottom dielectric layer has a thickness of 5 nm to 100 nm, and the stacks has a width of 2 nm to 200 nm.

* * * * *